(12) United States Patent
Topping

(10) Patent No.: US 11,631,544 B2
(45) Date of Patent: Apr. 18, 2023

(54) FLEXIBLE ENERGY STORAGE DEVICE

(71) Applicant: POWER ROLL LIMITED, Sunderland (GB)

(72) Inventor: Alexander John Topping, Alston (GB)

(73) Assignee: POWER ROLL LIMITED, Sunderland (GB)

( * ) Notice: Subject to any disclaimer, the term of this patent is extended or adjusted under 35 U.S.C. 154(b) by 189 days.

(21) Appl. No.: 16/978,958

(22) PCT Filed: Mar. 7, 2019

(86) PCT No.: PCT/GB2019/050645
§ 371 (c)(1),
(2) Date: Sep. 8, 2020

(87) PCT Pub. No.: WO2019/171069
PCT Pub. Date: Sep. 12, 2019

(65) Prior Publication Data
US 2021/0110977 A1  Apr. 15, 2021

(30) Foreign Application Priority Data
Mar. 8, 2018 (GB) .................... 1803690

(51) Int. Cl.
*H01G 4/32* (2006.01)
*H01G 11/10* (2013.01)
(Continued)

(52) U.S. Cl.
CPC .............. *H01G 4/32* (2013.01); *H01G 11/10* (2013.01); *H01G 11/70* (2013.01); *H01G 11/72* (2013.01); *H05K 1/162* (2013.01)

(58) Field of Classification Search
CPC .......... H01G 4/32; H01G 11/10; H01G 11/70; H01G 11/72; H01G 11/28
See application file for complete search history.

(56) References Cited

U.S. PATENT DOCUMENTS 9,083,010 B2   7/2015 Lockett et al.
2007/0117338 A1  5/2007 Yamamoto
(Continued)

FOREIGN PATENT DOCUMENTS

GB    1298228      11/1972
GB    2555009 A    4/2018
(Continued)

OTHER PUBLICATIONS

UK Combined Search and Examination Report, dated Aug. 10, 2018, 8 pages.
(Continued)

*Primary Examiner* — Eric W Thomas
(74) *Attorney, Agent, or Firm* — Husch Blackwell LLP

(57) ABSTRACT

The present invention relates to an energy storage device comprising a flexible substrate comprising at least two patterned regions spaced apart from one another along the length of the flexible substrate. Each patterned region comprises at least one groove extending in the longitudinal direction of the substrate (web direction) having a first and a second face, wherein the first and second faces are each coated with a conductor such that there is no direct electrical communication between the conductor on the first and second faces, the at least one groove contains a material for storing electrical potential energy (e.g. capacitive material), the first and the second face of the at least one groove of each patterned region are each in electrical connection with an electrical conductor at opposing edges of the flexible substrate, and the first and the second patterned region are electrically connectable to one another.

37 Claims, 19 Drawing Sheets

(51) Int. Cl.
*H01G 11/70* (2013.01)
*H01G 11/72* (2013.01)
*H05K 1/16* (2006.01)

(56) References Cited

U.S. PATENT DOCUMENTS

2016/0329604 A1* 11/2016 Izumi .................... H01M 4/661
2017/0271093 A1   9/2017 El-Kady et al.

FOREIGN PATENT DOCUMENTS

JP           64086053 A      3/1989
JP         2011023439 A  *   2/2011   ............. H01G 4/012

OTHER PUBLICATIONS

PCT International Search Report and Written Opinion, dated Jul. 8, 2019, 17 pages.
Indian Examination Report, Application No. 202037037924, dated Feb. 23, 2021, 6 pages.
Eurasian Patent Office Official Action, Publication No. EA202092128A1, dated May 27, 2022, 5 pages.

* cited by examiner

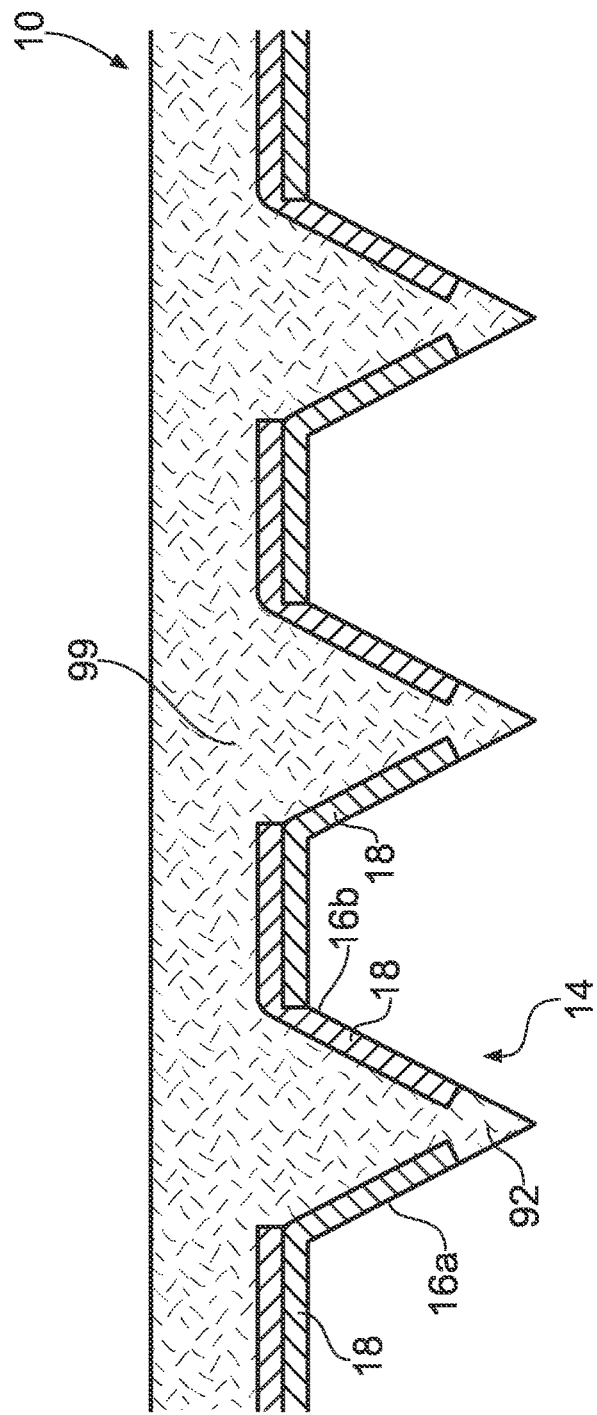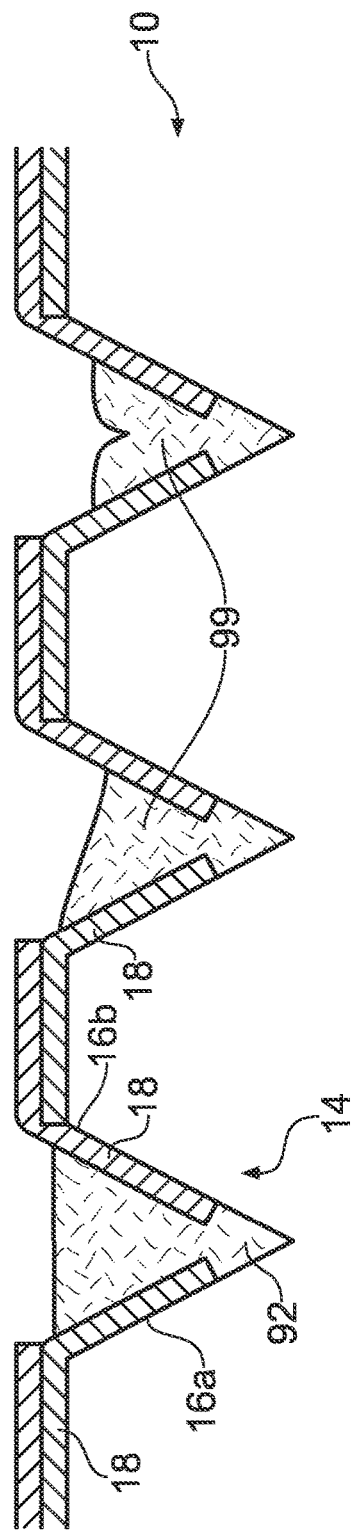

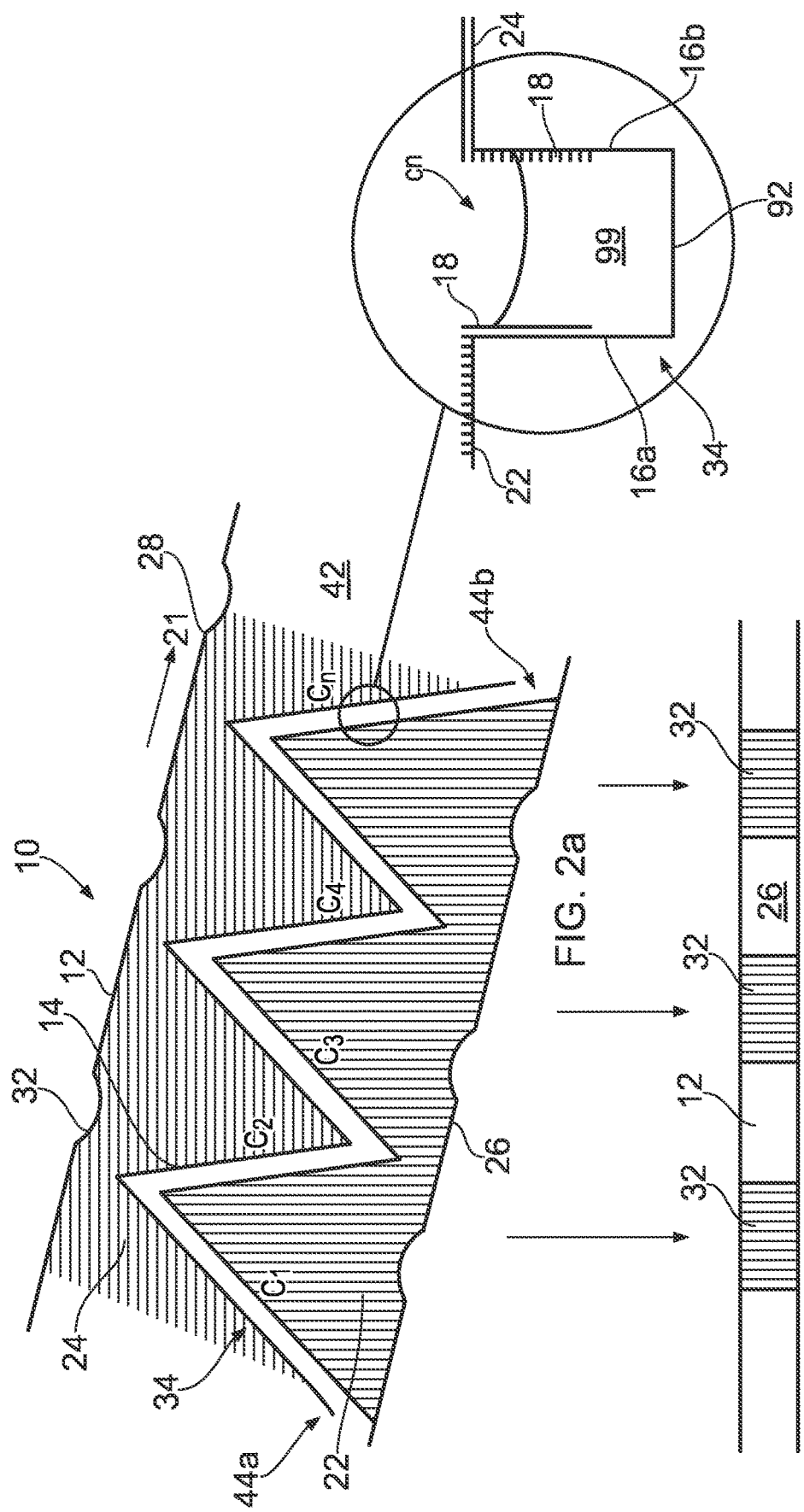

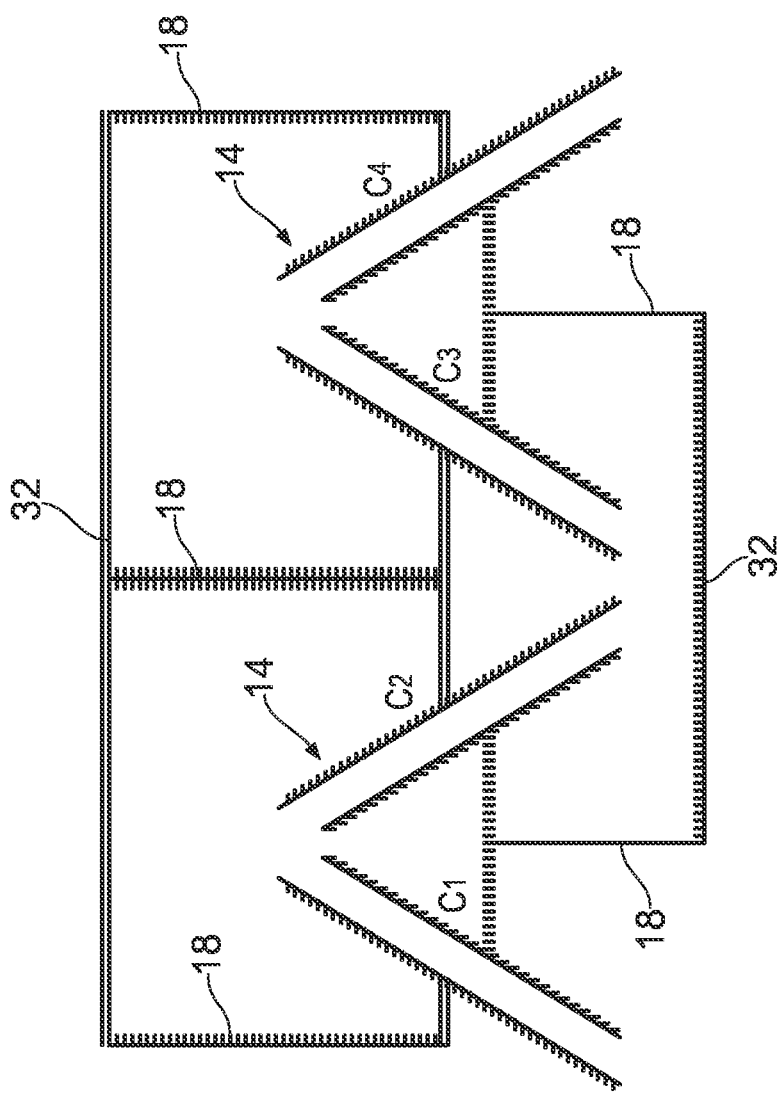
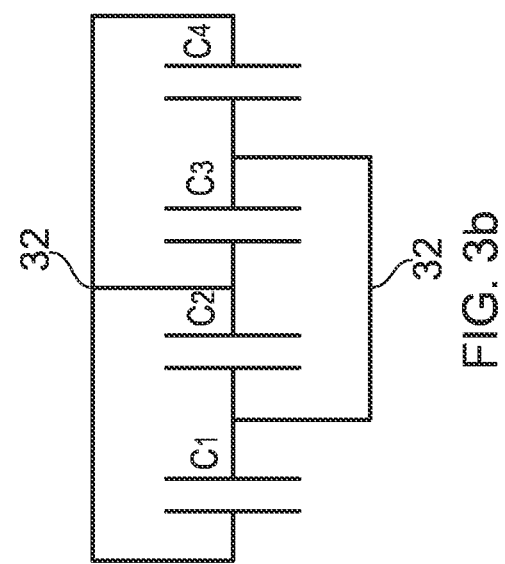
FIG. 3a
FIG. 3b

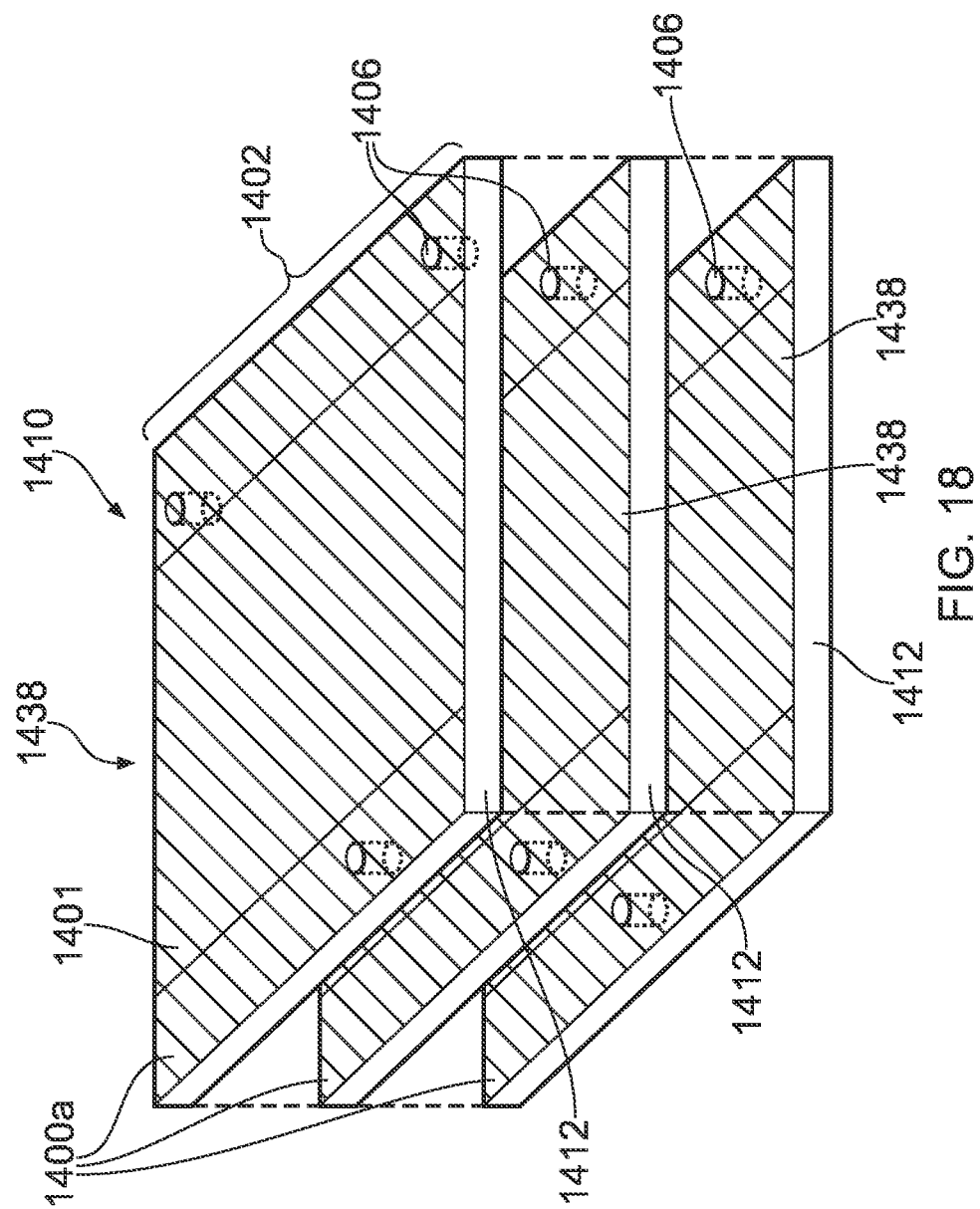

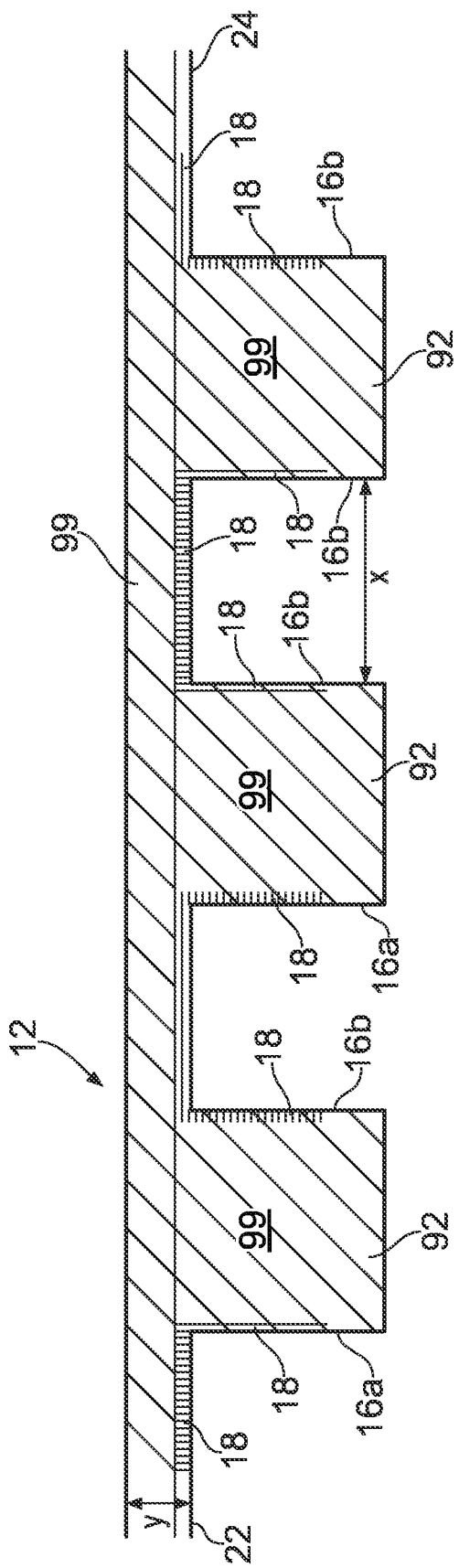

FLEXIBLE ENERGY STORAGE DEVICE

The present invention relates to an energy storage device and to a coated web for an energy storage device.

The demand for sources of renewable energy has driven significant improvements in the cost and efficiency of solar photovoltaic cells but existing technology still represents a relatively expensive method of generating electricity.

The demand for sources of renewable energy has also driven improvements in energy storage. The efficiency of energy storage must be increased and/or the cost of energy storage must be decreased, if renewable energy is going to meet more of the world's energy demand.

The present invention aims to mitigate one or more of the disadvantages of existing energy storage devices.

In accordance with a first aspect of the present invention there is provided an energy storage device comprising:
- a flexible substrate comprising at least two patterned regions spaced apart from one another along the length of the flexible substrate;
- each patterned region comprising at least one groove extending in the longitudinal direction of the substrate (web direction) having a first and a second face;
- wherein the first and second faces are each coated with a conductor such that there is no direct electrical communication between the conductors on the first and second faces;
- wherein the at least one groove contains a material for storing electrical potential energy (e.g. capacitor material); wherein the conductors on the first and the second face of the at least one groove of each patterned region are each in electrical connection with an electrical conductor at opposing edges of the flexible substrate;
- wherein the first and the second patterned region are electrically connectable to one another.

The at least one groove provides the patterning in the patterned region.

When referred to herein, "web direction", "longitudinally" and "length" all relate to the longest dimension of the flexible substrate and/or the coated web. "Transversely" relates to a direction across the shortest dimension of the flexible substrate and/or the coated web in a direction perpendicular to the web direction.

In certain embodiments the first and the second patterned regions are electrically connectable to one another in series or in parallel electrical connection. More specifically, the at least one groove in each of the at least two patterned regions is electrically connectable to a further at least one groove in a patterned region. Yet more specifically, at least one groove in a patterned region is electrically connectable to another at least one groove in a further patterned region in series or in parallel electrical connection. In this way, when grooves in two separate patterned regions are in series electrical connection with one another, following the electrical conduction paths provided for electrical conduction each of the grooves in the patterned regions is arrived at successively. When grooves in two separate patterned regions are in parallel electrical connection with one, following the electrical conduction path between the grooves in the patterned regions, any of the grooves in the patterned regions can be arrived at by the electrical charge without having the cross any other one groove in any of the at least two patterned regions.

In certain embodiments, the first and second patterned regions are electrically connected to one another in series by a conductor material on the surface of the substrate between adjacent patterned regions.

In certain embodiments the conductor material is deposited on the surface of the substrate.

In certain embodiments the conductor material is printable conductive material. Yet more specifically, the conductor material is conductive ink.

In certain embodiments, the conductor material is coated, that is to say forms a coating, onto the substrate surface.

In certain embodiments, the conductor material is a conductive foil. More specifically, the conductive foil is laminated along the edges of the patterned region(s). More specifically, the conductive foil is formed of strips electrically connecting the edges of adjacent patterned regions. In this way, electrical connections between adjacent patterned regions are formed by the interconnecting conductive foil strips. Certain connections can be disconnected between patterned regions by removing (i.e. breaking) the conductive foil between the regions (e.g. by scratching or lasering the conductive foil off). In certain embodiments the conductive foil is a conductive metal foil.

In certain embodiments, the conductor material on the first face of the at least one groove extends to an edge of the patterned region. This conductor does not however coat the very extreme ends of the at least one groove.

In certain embodiments, the ends of the at least one groove are free of conductor. More specifically, in certain embodiments, the first face and the second face of the groove at the ends of the groove are free of conductor.

In certain embodiments, the conductor can be removed from the first face and the second face of the groove at the ends of the groove by creating a hole in the substrate at the end of a groove. For example, the end of the groove can be removed by creating a hole in the substrate.

In certain embodiments, the end of the groove can be masked to prevent conductor deposition on the faces of the groove at an end thereof. More specifically the mask may be one or more of: a removable tape and an oil based material for use in an oil pattern printing process.

The absence of conductor material from the faces at the end of the groove ensures there is no cross-groove short circuit possibility.

In certain embodiments, the conductor material on the second face of the at least one groove extends to an edge of the patterned region. This conductor does not however coat the very extreme ends of the at least one groove.

In certain embodiments, the conductor material on the first face of the at least one groove extends to an edge of the patterned region and the conductor material on the second face of the at least one groove extends to an opposing edge of the patterned region. In this way, each face of the groove is electrically connected to an edge of the patterned region. This conductor does not however coat the very extreme ends of the at least one groove.

In certain embodiments, the conductor material on the first face of the at least one groove extends to an edge of the patterned region thereby defining a positive pole of the patterned region in electrical communication with one of the faces of the groove and the conductor material on the second face of the at least one groove extends to an opposing edge of the patterned region thereby defining a negative pole of the patterned region in electrical communication with other face of the groove. This conductor does not however coat the very extreme ends of the at least one groove.

In certain embodiments, an electrical circuit is provided connecting the positive pole to the negative pole of the patterned region for charge extraction from the substrate.

In certain embodiments the ends of each groove are free from conductor material. More specifically, the ends of a groove lie outside the conductively coated portion of the patterned region.

Conductor material is deposited upon the flexible substrate surface which comprises at least two patterned regions each comprising at least one groove. Each of the at least two patterned regions is selectively coated with conducting material so that the majority of the patterned region is electrically conductive. The space between the first and second faces of the groove and the end of the groove are free from conductor material. A further conductive material deposited on the surface of the substrate between two patterned regions enables electrical conduction between the at least two patterned regions so that the described series and/or parallel electrical connections can be provided.

In certain embodiments, the first and second patterned regions are electrically connected to one another in series by a conductor material through the thickness of the substrate. More specifically, the first and the second patterned region each comprise an aperture through the substrate and containing a conductor material electrically connecting the patterned regions. More specifically, the conductor material is conductive adhesive material. In this way, when the flexible substrate is rolled to assemble a two terminal device, the first and the second patterned region overlay one another and the conductive material contained in the aperture electrically connects the first and the second patterned region.

In certain embodiments the apertures can be configured (adapted, arranged) to provide parallel, series and/or a combination of series and parallel electrical connections between patterned regions. More specifically, one or more apertures are located at a first side of the groove and one or more apertures are located at a second side of the groove in a patterned region. In this way, through the use of all of the apertures on both sides of the at least one groove in each of the at least two patterned regions a parallel connection can be formed. Alternatively apertures on only one side of the at least one groove in the at least two patterned regions can be used and alternated in subsequent patterned region in the web direction of the substrate creating a series connection.

It may be an advantage of the present invention that the device provides a reliable way to store electrical energy and in particular the device is less prone to short circuits compared to other known storage devices. Short circuits adversely affect the useful capacitance of the capacitor or supercapacitor.

It may be a further advantage of the present invention that, at the point of assembly, the device provides a reliable way to provide any voltage and/or capacitance to a load applied across the device, due to the ability to create larger capacitances through parallel connection and larger operating voltages through series connection of patterned regions on the flexible substrate.

In certain embodiments each patterned region comprises one or a series of grooves.

In certain embodiments, in a series of grooves, the second face of a first groove in the series is electrically connected to the first face of a second groove in the series and so on. In this way, the series of grooves comprises a plurality of grooves in series electrical connections with one another.

In certain embodiments, the at least two patterned regions comprise the same or a different groove pattern.

In certain embodiments, the flexible substrate comprises a plurality of patterned regions spaced apart from one another along the length of the flexible substrate. More specifically, the flexible substrate comprises a repeating pattern of patterned regions along the length of the flexible substrate. More specifically, the flexible substrate comprises three or more patterned regions spaced apart from one another along the length of the flexible substrate.

In certain embodiments, adjacent patterned regions are electrically connected in series.

In certain embodiments, each patterned region comprises at least one aperture. More specifically, the aperture is filled with a conductor material in electrical contact with a conductor material filling the aperture in an adjacent patterned region. In this way, adjacent patterned regions are electrically connected in series by the conductor material.

In certain embodiments, the conductor material in the aperture is in electrical connection with the first or the second face of the groove in the patterned region.

In certain embodiments, adjacent patterned regions are electrically connected in series by an aperture filled with conductor material electrically connecting the second face of a groove of a first patterned region with the first face of a groove of a second, adjacent patterned region. Alternatively, adjacent patterned regions are electrically connected in series by an aperture filled with conductor material connecting the second face of a groove of a first patterned region with the second face of a groove of a second, adjacent patterned region. It will be understood that for multiple patterned regions to be electrically connected in series, the second face of the at least one groove in the first patterned region in the series is electrically connected to the second face of the at least one groove in the second patterned region in the series, the first face of the at least one groove in the second patterned region in the series is then electrically connected to the first face of the at least one groove in the third patterned region in the series and so on.

In certain embodiments, adjacent patterned regions are electrically connected in parallel.

In certain embodiments, adjacent patterned regions are electrically connected in parallel by an aperture filled with conductor material connecting the first face of a first patterned region with the first face of a second patterned region and a further aperture filled with conductor material connecting the second of a first patterned region with the second face of a second patterned region.

In this way, when the flexible substrate is rolled at the point of manufacture (i.e. assembly), a first patterned region overlaying a second patterned region can be electrically connected in series or in parallel to one another through the apertures in the patterned regions. In this way, both parallel and series connections between patterned regions on the flexible substrate are possible. Thus, the voltage and capacitance of the device can be varied and controlled at the point of manufacture (i.e. assembly).

In this way, when the flexible substrate is slit into segments containing at least one patch said sections can be laid one on top of another and the series and parallel interconnection scheme outlined can be used to fabricate planar flexible capacitors. In this way, both parallel and series connections between patterned regions on the flexible substrate are possible. Thus, the voltage and capacitance of the device can be varied and controlled at the point of manufacture (i.e. assembly).

In certain embodiments, the electrical connections between adjacent patterned regions are formed by conductive material deposited on the substrate between adjacent patches electrically connecting patterned regions to one another.

In certain embodiments, each patterned region is spaced apart from the adjacent patterned region(s) in order to avoid unintentional electrical shorting between adjacent patterned regions.

In certain embodiments each patterned region extends transversely of the substrate to an edge of the substrate. More specifically, the edge of a patterned region is proximate an edge of the substrate.

In certain embodiments, each patterned region is spaced apart from one or more adjacent patterned regions in the longitudinal direction of the web.

In certain embodiments, during patterning of the flexible substrate with the patterned regions, the spacing between adjacent patterned regions is provided by a mask protecting the flexible substrate from application of the conductor(s) material. That is to say, when the conductor material is applied to the first face and the second face of the groove(s) respectively and to the surface of the flexible substrate between the first face and the second face and respective opposing edges of the substrate, a mask is provided at spaced intervals along the flexible substrate so as to prevent unwanted deposition of the conductor material onto the substrate surface between the patterned regions.

In certain embodiments the masking function to prevent the coating of conductive material between the at least two patterned regions is performed by any technique that can prevent or interrupt the coating of the conductor material(s) onto the substrate such that the region between the at least two patterned regions and a portion at the beginning and ending of the at least two patterned regions remains uncoated with conductor material(s). For example, punching a hole after coating with conductor material removes the conductor and the substrate from a portion between the at least two patterned regions. In a further example, masking of the substrate between the at least two patterned regions by in line oil printing or taping prevent conductor deposition on the substrate.

In certain embodiments, a patterned region comprises one or more unit cells.

In certain embodiments, a unit cell is electrically connected to one or more other unit cells in the patterned region.

In certain embodiments, a unit cell comprises a groove or a series of electrically connected grooves.

As described above, the first and second faces of the, or each groove, are each coated with a conductor such that there is no direct electrical communication between the conductor on the first and second faces and the, or each groove contains a material for storing electrical potential energy (e.g. capacitor material).

In certain embodiments, the first and/or second face or the, or each groove, is coated with more than one material. More specifically, the first and/or second face or the, or each groove, is coated with more than one conductor material. In certain embodiments, the conductor materials may be one or more of: a conductor or a semiconductor material.

In certain embodiments, a patterned region comprises a plurality of unit cells arranged longitudinally along the web.

In certain embodiments, a patterned region comprises a plurality of unit cells arranged transversely across the web.

In certain embodiments, a patterned region comprises a plurality of unit cells arranged transversely across the web (transverse web direction, TD) and a plurality of unit cells arranged longitudinally along the web (i.e. machine or web direction, MD or WD).

In certain embodiments, the plurality of unit cells arranged transversely across the web are electrically connected to one another in series.

In this arrangement, the total voltage of the unit cells connected in series transversely across the web is given by the equation:

$$V_T = V_1 + V_2 \ldots + V_n$$

Wherein, $V_T$ is the total voltage of the plurality of unit cells connected in series transversely across the web in the patterned region $V_1$, $V_2$ are the individual voltages of each unit cell connected in series transversely across the web n is the total number of unit cells connected in series transversely across the web in the patterned region The total capacitance of the unit cells connected in series transversely across the web is given by the equation:

$$C_T = \frac{1}{\frac{1}{C1} + \frac{1}{C2} + \frac{1}{Cn}}$$

Wherein, $C_T$ is the total capacitance of the plurality of unit cells connected in series transversely across the web in the patterned region $C_1$, $C_2$ are the individual capacitance of each unit cell connected in series transversely across the web n is the total number of unit cells connected in series transversely across the web In certain embodiments, a patterned region comprises a plurality of unit cells arranged longitudinally down the web which, when the flexible substrate is rolled at the point of assembly, are electrically connected to one another in parallel. More specifically, the patterned regions are connected in parallel by application of a conductor material to each end of the rolled substrate.

In this arrangement, the total voltage of the unit cells connected in parallel longitudinally down the web remains the same as the total voltage (VT) of the unit cell(s) in series transversely across the web.

The total capacitance of the unit cells connected in parallel longitudinally down the web is given by the equation:

$$C_T = C_1 + C_2 \ldots + C_n$$

Wherein, $C_T$ is the total capacitance of the plurality of unit cells connected in parallel longitudinally down the web in the patterned region $C_1$, $C_2$ are the individual capacitance of each unit cell connected in parallel longitudinally down the web n is the total number of unit cells connected in parallel longitudinally down the web In certain embodiments the patterned region comprises one or more rows of unit cells arranged transversely across the web, wherein each row comprises a plurality of unit cells arranged longitudinally down the web which are electrically connected to one another in parallel.

In certain embodiments, the patterned region comprises more than one row of unit cells arranged transversely across the web, wherein each row is electrically connected to the adjacent row in series connection.

In this way, the present invention provides a variable voltage and a variable capacitance device in which the voltage and capacitance output of the device is selectable according to the electrical connections (e.g. series and/or parallel) between patterned regions and/or between unit cells in each patterned region.

In certain embodiments the flexible substrate comprises a line of weakening (e.g. line of perforations) arranged longitudinally of the web. More specifically, the line of weakening defines a longitudinal line down the flexible substrate at which the substrate is separable into first and second longitudinal strips.

In certain embodiments the line of weakening comprises a series of perforations through the web.

In certain embodiments the line of weakening divides each of the at least two patterned regions into separable longitudinal strips.

Thus, in order to facilitate the conversion of the flexible substrate into longitudinal strips (e.g. by slitting the substrate longitudinally) and final assembly and connection of the electrical contacts between each of the patterned regions extending transversely across the web there may be a linear series of perforations travelling in the web direction parallel to the web edge.

In certain embodiment said perforations are coated with conductor material(s) in the same coating process that provides the conductive material coating to the at least two patterned regions.

In certain embodiments the linear series of perforations provides a point of reference for the separation of the flexible substrate longitudinally (forming strips of substrate having lesser dimension than the unseparated flexible substrate and comprising at least two patterned regions running down the web direction). As said perforations are conductively coated on their walls, once slit, they provide an increased surface area for electrical conduction so that once edge connection is required it will be made easier due to the increased contact area of the perforations which is presented at the slit edge(s).

In certain embodiments, the line of weakening comprises a series of depressions longitudinally spaced in the web direction of the flexible substrate.

In certain embodiments, the line of weakening comprises a depression running longitudinally of the flexible substrate.

In certain embodiments in order to facilitate the conversion of the flexible substrate into longitudinal strips (e.g. by slitting the substrate longitudinally) and final assembly and connection of the electrical contacts between each of the patterned regions extending transversely across the web there may be a linear depressed feature deformation of the surface of the substrate in the web direction (a channel feature) said feature being coated with conductor material(s) in the same coating process that provides the conductive coating to the at least two patterned regions. The linear depressed feature provides a point of reference for separation of the flexible substrate longitudinally (forming strips of substrate having lesser dimension than the unseparated flexible substrate and comprising at least two patterned regions. As the depressed feature is conductively coated on its wall(s), once slit, this provides an increased surface area of electrical conduction so that once edge connection is required it will be made easier due to the increased contact area of the depressed feature which is presented at the slit edge(s).

In certain embodiments, each unit cell comprises one or a series of grooves.

In certain embodiments, the first and the second face of the, or each, groove is in electrical contact with an edge connector on the flexible substrate.

In certain embodiments, in a series of grooves, the second face of a first groove in the series is electrically connected to the first face of a second groove in the series and so on. In this way, the series of grooves comprises a plurality of grooves in series electrical connections with one another.

In certain embodiments, the, or each, groove is typically an elongate groove.

In certain embodiments each unit cell comprises a series of substantially parallel, typically parallel grooves.

In certain embodiments the, or each, patterned region is connected to the edges of the flexible substrate by an edge connector comprising a conductor material.

In certain embodiments, the edge connectors of the device are connected in parallel with one another when the flexible substrate is rolled.

In certain embodiments, the edge connectors of the device are connected in parallel with one another when the flexible substrate is rolled applying a conductor material to the ends of the roll. In certain embodiments the conductor material is a metallic conductor.

In certain embodiments, the flexible substrate comprises a plurality of patterned regions each comprising a first and a second edge connector at opposing edges of the substrate and arranged for electrical connection to a load. In this way, the device is configured to provide an energy storage device in which the voltage and capacitance of the device can be configured to any required by an electrical load to be applied to the device.

In certain embodiments, the at least two patterned regions each comprise one or more grooves. More specifically, the first and the second face of the, or each, groove is electrically connected to a respective edge connector at an edge of the flexible substrate. More specifically, the first and second faces of the, or each, groove are electrically connected to an edge connector at opposing edges the flexible substrate.

In certain embodiments, the flexible substrate is elongate. More specifically the flexible substrate has a larger dimension in the web direction than transversely across the web.

The material for storing electrical potential energy may store the electrical potential energy in the form of one or more of chemical energy, electrostatic energy, pseudocapacitance and electrostatic double layer capacitance (EDLC).

In certain embodiments, the material for storing electrical potential energy is a capacitor or supercapacitor material in the groove.

In certain embodiments the capacitor material has the capacitance characteristics of a supercapacitor. It is optionally a supercapacitor material in the groove. The capacitor material may be a high dielectric capacitor material. It is normally a high dielectric capacitor material in the groove.

In certain embodiments the high dielectric capacitor material is a material other than air.

The energy storage device is typically an electrical energy storage device.

When the capacitor or supercapacitor material is in the groove, the capacitor or supercapacitor material may partially fill the groove, completely fill the groove or overfill the groove.

The first and/or the second face of the groove may be coated with, that is may have a coat of, conductor (e.g. metal). The conductor (e.g. metal) is typically in contact, normally electrical contact with the capacitor or supercapacitor material in the groove. The conductor (e.g. metal) may be referred to as a conductor(s) and typically electrical conductor(s). There is typically a gap between the conductor (e.g. metal) on the first face and the conductor (e.g. metal)

on the second face of the groove. The gap typically means that the conductor (e.g. metal) on the first face of the groove is not in electrical contact with the conductor (e.g. metal) on the second face of the groove. The gap is typically at the bottom of the groove.

It may be an advantage of the present invention that the groove defines a space between the conductor (e.g. metal) on the first face and conductor (e.g. metal) on the second face. The distance between the conductor (e.g. metal) on the first face is typically accurately defined, normally relatively accurately defined and/or consistent.

It may be an advantage of the present invention that the capacitor or supercapacitor material in the groove is less likely to suffer from the effects of voltage breakdown, compared to other known capacitors and supercapacitors. The energy storage device according to the present invention has reduced individual voltage across each groove. The number of grooves relates to the operating voltage of the device. Unlike other known capacitor/supercapacitor devices that require multiple laminated layers, the energy storage device according to the present invention does not require multiple laminated layers but rather uses a series of grooves in one layer. The device shares the voltage over a number of grooves so that the voltage in each individual groove is below the breakdown level for the capacitor or supercapacitor material in the groove.

The energy storage device may also be any two terminal device. More specifically, the device may be a two terminal device to which an electrical load can be connected. The first face of the groove may be coated with, that is may have a coat of, a conductor material and the second face of the groove coated with, that is may have a coat of, a conductor material.

The capacitor material is typically a high dielectric material or a high breakdown voltage material, typically a high voltage breakdown dielectric material. It may be an advantage of the present invention that the high dielectric material aids operation of the power supply from the energy storage device by smoothing out energy demand spikes, such as a surge when devices are turned on. The high dielectric material may be a high dielectric capacitor material.

The conductor material is in contact with the capacitor material in the groove. The capacitor or supercapacitor normally fills the volume of the groove not occupied by the conductor material.

The capacitor or supercapacitor material typically provides the function of a supercapacitor, also referred to as an ultracapacitor. The function of the supercapacitor may be provided by the supercapacitor material alone or may require the interaction of the supercapacitor material with the conductor material.

The capacitor or supercapacitor material may store electrical energy using static double-layer capacitance, electrically generated elastic deformation and/or electrochemical pseudocapacitance, and or electrical polarisation or any separation/polarisation of charge mechanism.

When the first face of the groove is coated with a conductor material; the second face of the groove coated with a conductor material; and there is a capacitor material in the groove, the capacitor or supercapacitor material may be in the groove and overfill the groove. When the capacitor or supercapacitor material overfills the groove, the capacitor or supercapacitor material is a dielectric and/or insulator between two neighbouring grooves.

It may be advantageous for the capacitor or supercapacitor material to overfill the groove, such that the material completely fills any remaining volume of the groove and also extends outside the and/or the volume of the groove. The capacitor or supercapacitor material may overfill a plurality of grooves in this way to the extent that the capacitor or supercapacitor material bridges across a plurality of grooves, forming a layer over them. The capacitor or supercapacitor material may be a dielectric between two or more adjacent grooves. Overfilling the groove(s) may result in greater adhesion of the capacitor or supercapacitor material to the substrate and/or other components of the device, and/or may increase the resulting capacitance of the device.

In certain embodiments the capacitor is formed of one or more of the following materials: metal/mixed metal oxides (e.g. Aluminium oxide, Titanium dioxide, Zinc magnesium titanate, Zinc strontium titanate, Niobium pentoxide, Lead Zirconium Titanate, Tantalum pentoxide, Zinc niobium oxide, Magnesium niobium oxide, Zinc tantalum oxide, Magnesium tantalum oxide, Barium titanate, Barium strontium titanate); organic polymers (e.g. Polypropylene, Polyethylene terephthalate, Poly(vinylidene fluoride), and copolymers of vinylidene fluoride with one or more of: Chlorotrifluoroethylene, Trifluoroethylene, Hexafluoropropylene, chlorofluoroethylene); Cellulose, and cellulose derivatives such as, for example, Cellulose acetate, diacetate or triacetate, Alkylsilyl cellulose, Cyanoalkylated or alkylated cellulose.

In certain embodiments the capacitor material comprises composites of any of the polymers listed above with particles of one or more of the metal oxides listed above of size 5 nm-1 μm.

In certain embodiments the capacitor material comprises composites of any of the polymers listed above with nanoparticles of one or more of the metal oxides listed above.

In certain embodiments the capacitor material comprises a salt solution, where the salt is one or more of: Sodium chloride, Potassium chloride, Potassium hydroxide, an alkylammonium or alkylimidazolium tetrafluoroborate, an alkylammonium or alkylimidazolium bis(trifluoromethylsulfonyl)imide, an alkylammonium or alkylimidazolium trifluoromethanesulfonate, an alkylammonium or alkylimidazolium hexafluorophosphate, and a salt of sulphuric acid or adipic acid. Other suitable salt solutions may be used in certain embodiments of the invention.

In certain embodiments the capacitor material comprises a ionic (salt of other material in solution) solution in an insulating scaffold, where the salt is one or more of: Sodium chloride, Potassium chloride, an alkylammonium or alkylimidazolium tetrafluoroborate, an alkylammonium or alkylimidazolium bis(trifluoromethylsulfonyl)imide, an alkylammonium or alkylimidazolium trifluoromethanesulfonate, an alkylammonium or alkylimidazolium hexafluorophosphate, sulphuric acid or adipic acid. In certain embodiments the scaffold may be formed from: insulating nanoparticles (eg silicon oxide); high dielectric nanoparticles; porous polymers; or any insulating medium that accepts the ionic solution.

In certain embodiments the salt solution comprises one or more of the following solvents: water, acetonitrile, propylene carbonate, ethylene carbonate, gamma butyrolactone, ethylene glycol and propylene glycol; and/or one or more of the following polymers: polyethylene oxide, polyacrylonitrile, polymethylmethacrylate, poly(vinyl alcohol).

In certain embodiments the, or each groove provides an electrolytic capacitor in which the first face of the groove is coated with a metal, the second face of the groove is coated with a metal and an oxide/insulating layer and the groove contains a conducting liquid connecting the top of the oxide layer to the metal of the first face. Alternatively, the, or each groove provides an electrolytic capacitor in which the second face of the groove is coated with a metal, the first face of the groove is coated with a metal and an oxide/insulating layer and the groove contains a conducting liquid connecting the top of the oxide layer to the metal of the second face.

In certain embodiments, the supercapacitor material comprises one or more of the capacitor materials and the face and/or second face of the groove(s) is profiled to increase the surface area of the face.

The grooves can be considered accepting structures for capacitor materials that through their introduction result in a measurable increase in charge storage capability of the groove over that of just the ambient atmosphere residing within the grooves between the separated conductor materials on the faces of the groove. This capacitor material can be such that it forms an electrostatic capacitor wherein the capacitance is proportional to the area of separated conductor overlap inverse of the space between the separated conductors. Alternatively the capacitor material introduced into the groove can form a double layer capacitance effect wherein the capacitance is dominated by the charged atomic/molecular layer adjacent to the surface of the separated conductors.

In certain embodiments the accepting structure (i.e. the groove) can be filled with materials wherein a dipole or dipoles can be generated or manipulated within the material through the application of an external electric field across the separated conductors resulting in a high degree of material polarisation and displacement form equilibrium condition of the material where this displacement is the source of the stored charge/energy.

In certain embodiment any material that limits electrical conduction across the groove but allows for a high degree of self-polarisation or separation of charges, at least for some range of frequencies, would be a suitable materials to be considered for filling the groove and thus making a useful capacitor system.

In use, the device typically stores electrical energy. The device may be in electrical communication with a load. The load is typically an electrical component that consumes electric energy. The load may for example be a light bulb.

In use, the capacitor or supercapacitor material typically stores electrical energy or charge that the load does not consume. In this way, excess electrical energy can be stored for future use by the load. There is therefore electrical energy available to the load when the source of electrical energy is not generating electrical energy or sufficient electrical energy.

A first side of the groove typically comprises the first face of the groove and a first surface of the substrate adjacent the groove. A second side of the groove typically comprises the second face of the groove and a second surface of the substrate adjacent the groove. The first and second surfaces adjacent the groove are typically at least substantially parallel with and/or in the same plane as the substrate. The first and second side of the groove are typically on the same surface of the substrate.

In certain embodiments, the first and second faces of the groove are from about 2 to about 20 microns high. That is to say, the empty depth of the groove is from between about 2 to about 20 microns.

If the groove has a v-shaped cross-section, the height of the first face of the groove is normally measured from a junction between the first face of the groove and the first surface of the substrate and a junction between the first and second faces of the groove. The height of the second face of the groove is normally measured from a junction between the second face of the groove and the second surface of the substrate and a junction between the second and first faces of the groove. If the groove has a square shaped or circular cross-section, then the height of the first face of the groove is normally measured from a junction between the first face of the groove and the first surface of the substrate and the lowest point in the groove which falls between the first and second faces. The height of the second face of the groove is normally measured from the lowest point in the groove which falls between the first and second faces.

The height of the first and second faces of the groove may be at least substantially the same or different.

In certain embodiments the width of the groove(s) is in the range of between about 0.3 and about 10 microns, typically 1 micron and about 10 microns. That is to say, the distance between the first surface of the substrate adjacent the groove and the second surface of the substrate adjacent the groove across the mouth of the grove is between about 0.3 and about 10 microns, typically 1 micron and about 10 microns.

In certain embodiments, the first and/or second face of the groove(s) is profiled (e.g. engineered, roughened, textured). In this way, the surface area of the first and/or second faces is increased when compared to a smooth groove face.

The first and second sides of the groove are normally each coated with the conductor material. The conductor material on the first side of the groove and the conductor material on the second side of the groove are typically in contact with the capacitor material in the groove.

The first face of the groove is normally at a first angle relative to a normal from the substrate and the second face of the groove is normally at a second angle relative to the normal from the substrate. The first and second angles are normally from 0 to less than 90°. In certain embodiments the first and second angles are normally from 0 to 75°.

The first and the second face of the groove typically define a cavity of the groove therebetween.

The first and second faces of the groove may each have a first and a second end. The first ends are typically in contact at the centre of the groove and/or bottom of the cavity, the second ends detached at a top of the cavity. In an alternative embodiment the first and second faces separately contact a base of the groove. The base of the groove may be a bottom of the groove.

The conductor material may be at least one layer of conductor material. The conductor material is normally in contact with one or more of the first face, first surface, second face and second surface of the groove.

The conductor material is normally one or more of on, in contact with and coated on the second face of the groove and second surface of the substrate adjacent the groove. The conductor material may further be one or more of on, in contact with and coated on the first surface of the substrate adjacent the groove.

The groove may be any shape, may be symmetrical, may be an asymmetric v-shape. The first face of the groove may be longer than the second face of the groove or the second face of the groove may be longer than the first face of the groove.

The conductor material coat and/or cover about 50%, preferably about 85%, of the second face and/or first face of the groove respectively, one or more of the capacitance, breakdown voltage and current capability of the device is increased.

The coat of the conductor material may be from 20 nm to 1000 nm thick, normally from 25 nm to 500 nm thick and typically from 30 nm to 200 nm thick. The coat of the conductor material material may therefore be referred to as a relatively thin coating.

It may be an advantage of the present invention that when the another conductor thickness is about 200 nm, one or more of the capacitance, breakdown voltage and current capability of the device is increased.

The capacitor or supercapacitor material may be and/or may be referred to as a dielectric and/or insulator material. The insulator material is typically an electrical insulator material.

The conductor material may be an electrical conductor.

In certain embodiments the conductor material is metallic.

In certain embodiments the conductor material is non-metallic. More specifically, the conductor is a carbon conductor or conductive ceramic.

The conductor material may comprise one or more of aluminium, bismuth, cadmium, chromium, copper, gallium, gold, indium, lead, magnesium, manganese, samarium, scandium, silver, tin, zinc, terbium, selenium, molybdenum, yttrium, holmium, calcium, nickel, tungsten, platinum, palladium, vanadium, carbon and stainless steel. In will be understood that the conductor material may be any material other than an electrical insulator. The conductor material may be a semiconductor material. In this way, the conductor material allows charge transfer therethrough.

A surface of the substrate comprising the at least one groove is referred to as a patterned region. The patterned region is typically not flat. The substrate may have another surface that is flat.

The device may be referred to as a two terminal device.

When the device comprises a plurality of grooves, the plurality of grooves may be formed into a first and a second series of grooves which may be referred to as cascaded groove structures. In use the device may be fabricated in a series arrangement and operated in a parallel or a combined series and parallel arrangement.

Each groove and/or the grooves of the patterned region(s) may be from 0.3 to 200 m long, normally from 3 to 300 m long. Each groove and/or the grooves of the patterned region(s) is typically greater than 100 m long, optionally greater than 1000 m long, normally greater than 5000 m long and may be greater than 10,000 m long. Each groove and/or the grooves of the patterned region(s) is typically from 0.3 to 100 µm wide, normally from 0.3 to 10 µm wide. More specifically, the groove and/or the grooves of the patterned region(s) is from 1 to 5 µm wide.

In certain embodiments, each patterned region comprises a groove or parallel electrically connected series of grooves may have an effective length of up to 100, 000, 000 m.

The substrate may comprise a curable resin and in particular a UV curable resin. The substrate may comprise a curable resin layer and a flexible base layer. The base layer may comprise an insulating layer. The flexible substrate may comprise: one or more of an acrylic resin coated onto polyvinyl chloride (PVC), acrylic resin coated onto polyethylene terephthalate (PET), acrylic resin coated onto polyethylene naphthalate (PEN), a biopolymer coated onto polyvinyl chloride (PVC), a biopolymer coated onto polyethylene terephthalate (PET) and a biopolymer coated onto polyethylene naphthalate (PEN).

The energy storage device may comprise a first and a second substantially planar face.

The patterned region(s) are typically in the first substantially planar face.

In certain embodiments the groove(s) include a first outermost groove and a second outermost groove.

There may be at least a first and a second hole in the substrate in each patterned region. The first hole normally provides electrical communication between the first outermost groove and the second substantially planar face of the substrate and the second hole provides separate electrical communication between the second outermost groove and the second substantially planar face of the substrate.

Sides of the first and second holes are normally coated with one or more of the conductor material, and the second conductor material.

The first hole typically passes through the first substantially planar face of the substrate proximate to the first outermost groove and through the first electrical conductor on the second substantially planar face of the substrate. The second hole typically passes through the first substantially planar face of the substrate proximate to the second outermost groove and through the second electrical conductor on the second substantially planar face of the substrate.

The holes typically have a diameter of from 0.5 to 2000 microns. The hole may be elongate. The hole may be a slot.

The first and second holes are normally at least partially filled with an electrical conductor material. The electrical conductor material may be a conductive ink.

The substrate may also comprise the first and the second holes.

The conductor on the first face of the groove may be referred to as a first conductor. The conductor on the second face of the groove may be referred to as a second conductor.

In certain embodiments, the first and/or the second conductor is a metal.

In certain embodiments, the first and/or the second conductor is a non-metal (e.g. carbon).

In certain embodiments, the first and/or the second conductor is a semiconductor.

Statistical variation in the distance between the conductors on the first and second faces means that, in use, some short circuits may occur in the device due to fabrication variance if left untreated. After the conductors have been applied to the substrate, a short circuit detection and mitigation/removal process may be implemented. For example, the capacitance and/or the electrical properties of the conductively coated substrate may first be measured. The measured capacitance and/or the electrical properties will allow an assessment as to whether any short circuits are present therein. If mitigation or removal of any short circuits is then desired, a variable-frequency AC voltage, a DC voltage, a pulsed DC voltage or an AC voltage may be passed through the conductor(s) on the conductively coated substrate.

The passing of the required electrical current through the defective region (patch) is made easier due the electrically isolated nature of the patch arrangement, as application of voltage will be restricted to the region of conduction adjacent to and the patch itself. This means in operation only a small portion of the total web comprising many patches will be energised allowing for standard converting systems and machines to be used as electrical conduction outside of the treated region is restricted and subsequent electrically conducting rollers and elements coming into contact with the coated web will not be effected by the mitigation technique.

The, or each, groove is typically in one layer. In use, the device normally shares the voltage over a number of grooves. More specifically, the, or each groove is typically in a resin layer of the flexible substrate.

The second face of a first groove is typically in electrical communication with a first face of a second groove. The second face of the first groove may be in electrical contact with the first face of the second groove.

There may be any number of grooves. The number of grooves is typically dependent on the type of capacitor or supercapacitor material in the grooves and/or width of the grooves.

There is normally from 1 to about 2000 grooves in each patterned region. Having two grooves in series compared to one groove doubles the voltage and halves the capacitance of the energy storage device. Having three grooves in series compared to one groove triples the voltage and thirds the capacitance of the energy storage device, and so on.

According to another aspect of the invention there is provided a coated web for an energy storage device comprising:
- a flexible substrate comprising at least two patterned regions separable from one another and arranged transversely across the width of the flexible substrate;
- each patterned region comprising at least one groove having a first and a second face; wherein the first and second faces are each coated with a conductor such that there is no direct electrical communication between the conductor on the first and second faces; wherein the at least one groove contains material for storing electrical potential energy (e.g. capacitor material); and wherein first and the second face of the at least one groove of each patterned region are each in electrical connection with an electrical conductor coating layer on the surface of the flexible substrate, and wherein the flexible substrate comprises at least one deformation in the electrical conductor and the flexible substrate and adjoining adjacent patterned regions.

In certain embodiments the coated web comprises flexible polymer or other electrically insulating substrate. More specifically, a coated web according to embodiments of the invention may be processed (e.g. cut longitudinally) to form a flexible substrate according to embodiments of the invention. The flexible substrate so formed can be rolled to form an energy storage device according to the invention. More specifically, the flexible substrate so formed may be the flexible substrate of an energy storage device according to the first aspect of the invention.

In certain embodiments, the coated web comprises a flexible substrate comprising a polymer base layer and a resin layer.

In certain embodiments the at least one deformation forms a line of weakening between the adjacent patterned regions arranged transversely across the width of the flexible substrate.

In certain embodiments the line of weakening is parallel to the longitudinal axis of the flexible substrate. That is to say, the line of weakening extends in the web direction of the flexible substrate.

In certain embodiments the at least one deformation is an aperture, a recess, a dimple of the like. In this way, when the deformation is cut through at an angle normal to the surface of the substrate, the exposed surface area of the substrate at the edge in the area of the deformation is greater than the exposed surface area of the substrate at the edge not including the deformation.

In certain embodiments, the flexible substrate comprises at least one aperture therethrough.

In certain embodiments, the flexible substrate comprises a plurality of apertures through the flexible substrate.

In certain embodiments the at least one aperture is located in a patterned region.

In certain embodiments the flexible substrate comprises a plurality of apertures therethrough.

In certain embodiments, each patterned region comprises at least one aperture therethrough.

In certain embodiments, each patterned region comprises an aperture therethrough in both the first and the second surfaces of the patterned region.

In certain embodiments, the flexible substrate comprises a plurality of apertures through the flexible substrate at each opposing edge.

In certain embodiments, each aperture comprises an aperture wall.

In certain embodiments the aperture wall is coated with a conductor material. More specifically the aperture wall have a conductive coating. The conductive coating may be metal or a non-metallic conductive material.

In certain embodiments, the aperture wall is profiled (e.g. engineered, roughened, textured). In this way, the surface area of the aperture wall is increased when compared to a smooth aperture wall.

In certain embodiments the electrical conductor coating layer on the surface of the flexible substrate is a metal coating layer. More specifically, the metal coating is formed as a metal layer on the surface of the flexible substrate.

In certain embodiments the groove(s) progress longitudinally down the length of the flexible substrate.

In certain embodiments, the groove(s) extend longitudinally and transversely of the web. More specifically, the groove(s) extend in a zig zag pattern on the substrate. Alternatively, the groove(s) extend in a saw tooth, square wave form or similar pattern on the substrate or any combination thereof.

In certain embodiments, the groove(s) comprise a transversely extending portion and a longitudinally extending portion.

In use of the coated web of the present invention, the web is slit longitudinally along its length to cut through the apertures in the substrate. In this way, a plurality of smaller coated web strips are formed, each with at least a portion of at least one aperture at each opposing edge thereof. In this way, the conductive material on the aperture wall(s) forms an edge connector on the coated web strips.

In accordance with a yet further aspect of the present invention there is provided an energy storage device comprising:
- a flexible substrate comprising at least two grooves in a surface thereof, each groove having a first and a second face;
- each of the grooves being spaced apart from one another along their length providing an inter-groove spacing therebetween;
- wherein each groove contains a material for storing electrical potential energy (e.g. capacitor material) and the material for storing electrical potential energy overfills each groove such that the material provides a layer of material for storing electrical potential energy over at least a portion of the substrate surface adjacent the first and the second faces of each groove and the inter-groove spacing, wherein the ratio of the inter-groove spacing to the depth of the layer of material for storing electrical potential energy is at least 1:1.

In certain embodiments the ratio of the inter-groove spacing to the depth of the layer of material for storing electrical potential energy is between about 1:1 and about 5:1. More specifically the ratio of the inter-groove spacing to the depth of the layer of material for storing electrical potential energy is at least 2:1.

In certain embodiments the depth of the layer of material for storing electrical potential energy is less than about 10 microns. More specifically the depth of the layer of material for storing electrical potential energy is between about 2 microns and about 20 microns.

The depth of the layer of material for storing electrical potential energy is measured from the top of that layer to the surface of the substrate layer outwith the groove.

In certain embodiments, the flexible substrate comprises an overlayer. More specifically the overlayer is on the surface of the resin opposite the base layer.

In certain embodiments the overlayer is between about 0.8 microns and 30 microns thickness.

In certain embodiments, the ratio of the inter-groove spacing to the depth of the layer of material for storing electrical potential energy is greater than 1:1. That is to say, the depth of the layer of material for storing electrical potential energy is less than the inter-groove spacing distance between the grooves. In this way, the layer of material does not reach a depth at which the capacitance of the grooves behaves as a single groove.

Embodiments of the invention will now be described by way of example only and with reference to the accompanying drawings, in which:

FIG. 1a is a cross-sectional view of grooves of an energy storage device showing overfill according to an embodiment of the present invention;

FIG. 1b is a cross-sectional view of grooves of an energy storage device showing partial fill according to an embodiment of the present invention;

FIG. 2a shows a portion of the energy storage device with the flexible substrate unwound prior to assembly of the device according to an embodiment of the invention;

FIG. 2b is a cross-sectional view of a groove of an energy storage device from a capacitor according to an embodiment of the present invention;

FIG. 2c is an end view of the energy storage device of FIG. 2a;

FIGS. 3a and 3b show an electrical circuit for charge extraction from the energy storage device FIG. 2a;

FIG. 18 shows an alternative energy storage device according to an embodiment of the invention; and FIG. 19 is a cross-sectional view of grooves of an energy storage device showing overfill according to an embodiment of the present invention.

Throughout the figures, where possible, like features are depicted by the same, or similar reference numerals.

Figure 4:
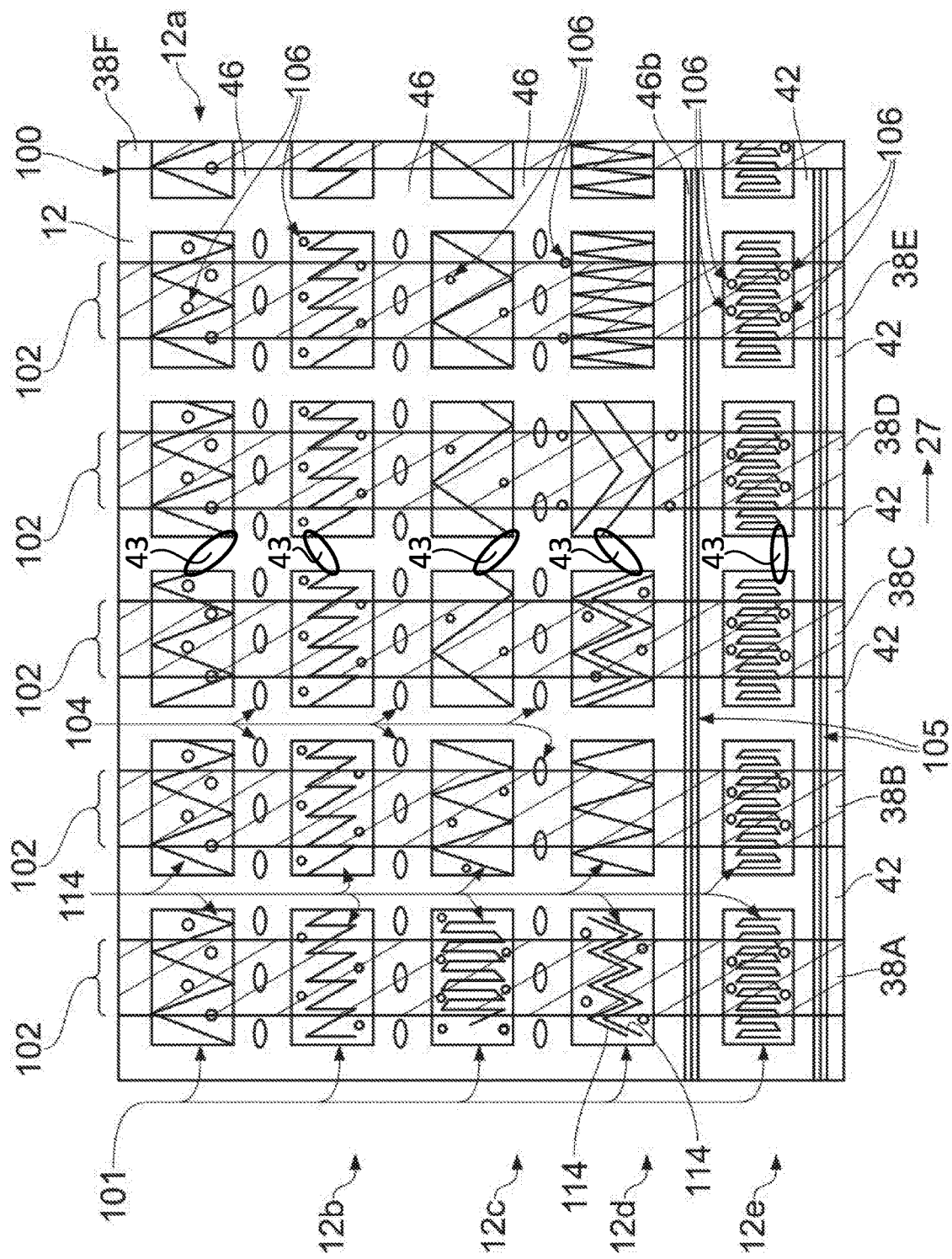
FIG. 4 shows a coated web according to an embodiment of the second aspect of the invention.

FIG. 1a shows the energy storage device 10 comprising a series of grooves 14 and capacitor/supercapacitor material 99. The walls of the grooves 14 have a coat of metal conductor 18.

The coat of metal 18 on the first face 16a of the groove 14 is not in electrical contact with the coat of metal 18 on the second face 16b of the groove 14. There is a gap 92 at the bottom of the groove 14 between the coat of metal 18 on the first face 16a of the groove 14 and the coat of metal 18 on the second face 16b of the groove 14. Each coat of metal 18 may also referred to as a conductor material.

In FIG. 1a the capacitor/supercapacitor material 99 overfills the grooves 14. FIG. 1b shows the same features of an energy storage device according to the present invention but the capacitor/supercapacitor material 99 only partially fills the grooves 14.

FIG. 1b shows the same energy storage device 10.

FIG. 2a shows a portion of the energy storage device 10 with the flexible substrate 12 comprising a groove 14 extending in the longitudinal direction of the web 18. A patterned region 38 comprises the groove 14 and the ends of the grove 14 extend beyond the ends of the patterned region 38. The groove 14 has a zigzag patterned which also has a directional component which extends in a transverse direction 19 of the web. The groove 14 contains a capacitor/supercapacitor material (99, see FIG. 2b) in contact with the coat of metal 18 on each of the first face 16a and the second face 16b of the groove 14. There is a gap 92 at the bottom of the groove 14 between the coat of metal 18 on the first face 16a of the groove 14 and the coat of metal 18 on the second face 16b of the groove 14. The coat of metal conductor 18 is also deposited on a first surface 22 and a second surface 24 of the flexible substrate 12. The coat of metal 18 on the first surface 22 is in contact with the coat of metal 18 on the first face 16a of groove 14. The coat of metal 18 on the second surface 24 is in contact with the coat of metal 18 on the second face 16b of groove 14.

The coat of metal 18 on the first surface 22 extends to a first edge 26 of the flexible substrate 12 and is in contact with a coat of metal (or other conductor material) (not shown) covering edge connectors 32 located at the first edge surface 26 of the flexible substrate 12.

The coat of metal 18 on the second surface 24 extends to a second edge 28 of the flexible substrate 12 and is in contact with a coat of metal (or other conductor material) (not shown) covering edge connectors 32 located at the second edge surface 28 of the flexible substrate 12.

The patterned region 38 has a masked region 42 at each end thereof. In the masked regions, the flexible substrate surface does not have a metal coating and is free from conductor material. In this way, adjacent patterned regions 38 (only one of which is shown in the depicted embodiment), are electrically isolated from one another on the unwound flexible substrate 12 by the masked regions 42.

The groove 14 extends into the masked regions 42. In this way, the faces 16a and 16b of the groove 14 at its ends 44a, 44b are free from conductor (the coat of metal 18).

As best shown in FIG. 2c, the edge connectors 32 are spaced apart from one another in the longitudinal direction 21 of the flexible substrate 12. Each edge connector 32 has a wall which is coated with a conductor material (not shown) such as a metal layer. In this way, the edge connectors 32 can be electrically connected to a load.

As best shown in FIG. 2b, capacitor C1 is formed by one section 34 of groove 14. A coat of metal 18 is deposited on a first face 16a of the groove 14 and on the first surface 22 of the flexible substrate 12. The coat of metal forms one electrical pole of the device 10. A coat of metal 18 is deposited on a second face 16b of the groove 14 and on the second surface 24 of the flexible substrate 12. The coat of metal forms a further and opposing electrical pole of the device 10. Capacitor material 99 is contained in the groove 14 and contacts the coats of metal 18 on each of the faces 16a and 16b of groove 14. An electrical circuit can be formed on the flexible substrate 12 by connecting the electrical poles for charge extraction from the substrate 12 via the groove 14.

As shown in FIG. 2a, capacitors C1, C2, C3 and Cn are provided, in parallel electrical connection with one another on the flexible substrate 12.

FIGS. 3a and 3b show an electrical circuit 36 for charge extraction from the energy storage device 10 of FIG. 2a. Capacitors C1, C2, C3 and C4 are formed by groove 14 (having the structure shown in FIG. 2b) in which the apexes of the zigzag pattern are removed for clarity. The coat of metal 18 on which of the first face 22 and the second face 24 form the electrical connections between the capacitors C1, C2, C3 and C4 and the edge connectors 32.

The total capacitance of the patterned region 38 is then equal to the capacitance values of C1, C2, C3 and C4 added together.

FIGS. 2a, 2b, 2c and 3a and 3b show the same energy storage device 10.

FIG. 4 shows a coated web section 100 for forming an energy storage device. The coated web 100 comprises a flexible substrate 12 formed form a polymer base layer coated with embossing resin (not shown).

The coated web section 100 comprises a number of strips of flexible substrate 12a, 12b, 12c, 12d, 12e initially joined together along lines of weakening 46. Lines of weakening are formed by perforations 104 extending through the flexible substrate 12 in longitudinally web direction 21.

A number of patterned sections 38A to 38F are spaced apart from one another by masked regions 42 in the web direction 21 of the flexible substrate 12.

Each patterned section 38A to 38F has a masked region 42 at each end thereof. In the masked regions, the flexible substrate surface does not have a metal coating and is free from conductor material. In this way, adjacent patterned sections 38A to 38F are electrically isolated from one another on the unwound flexible substrate 12 by the masked regions 42. Holes 43 are punched in the substrate between two adjacent patterned sections 38C and 38D so as to ensure the ends of the groove in those areas are free from conductor. It will be understood that in any of the depicted embodiments and in variations thereof, holes 43 can be punched in the flexible substrate between two adjacent patterned regions to ensure the ends of the groove in those areas are free from conductor. In this way, the masked regions could initially be coated with conductor and the holes punched out after application of the conductor to remove the conduction path between adjacent patterned regions.

Each patterned section 38A to 38F comprises at least two patterned regions (38 in FIG. 2a) separable from one another along the perforation line 46 adjoining the two patterned regions 38. The patterned regions 38 and arranged transversely across the width of the flexible substrate 12.

Each patterned region 38 comprises a unit cell (e.g. a patch) 101 having at least one groove 114.

Each patch 101 of a patterned region 38 comprises the groove 114 and the ends of the grove 114 extend beyond the ends of the patterned region 38. In this way, the ends of the groove 114 remain uncoated by conductor coating 102. Holes 43 are punched in the substrate between two adjacent patches 101 so as to ensure the ends of the groove in those areas are free from conductor.

The patches 101 within each patterned region 38 on each strip of flexible substrate 12a to 12e comprise at least one groove 114. The groove 114 on flexible substrate strip 12a has a zigzag configuration. The groove 114 on flexible substrate strip 12b has a zigzag configuration wherein the transverse element of the groove extends normal to the edges of the strip 12b. The groove 114 in the first patch 101 on flexible substrate strip 12c has a zigzag configuration wherein the transverse element of the groove extends normal to the edges of the strip 12b and the longitudinal element of the groove does not extend across the width of the strip.

The first patch 101 on the flexible substrate strip 12d comprises a series of parallel grooves with a zigzag configuration.

It will be understood that each patch 101 on the coated web 100 may have any suitable groove configuration.

Each groove 114 has the structure of the groove shown and described in FIGS. 1a and 1b and 2a to 2c above.

Some or all of the perforations 104 along the line of weakening 46 have a conductive coating 102 on the wall of the perforation. In this way, when the coated web is cut or slit along the lines of weakening 46 to form the flexible substrates 12a to 12e of the energy storage device 10 (FIGS. 1 and 2), edge connectors (32 in FIGS. 2 and 3) are formed at the edges of the cut strips 12a to 12e.

In alternative embodiments not shown, the perforations 104 may take the form of an aperture, a recess (46b), a dimple or other deformation in the flexible substrate surface 12. In this way, when the deformation is cut through at an angle normal to the surface of the substrate 12, the exposed surface area of the substrate at the edge in the area of the deformation is greater than the exposed surface area of the substrate at the edge not including the deformation.

The coated web 100 has apertures (e.g. holes) 106 through the substrate 12. Each aperture 106 is coated with metal (not shown) so as to allow conductive communication to be established between different patches 101 when the flexible substrates 12a to 12e are assembled into energy storage devices 10.

In use, the coated web 100 is slit longitudinally along its length to cut through the perforations 104 along the lines of weakening 106 in the substrate 12. In this way, a plurality of smaller coated web strips 12a to 12e are formed, each with at least a portion of at least perforation 104 at each opposing edge thereof. In this way, the conductive material on the perforation wall(s) forms an edge connector on the coated web strips.

Figure 5:
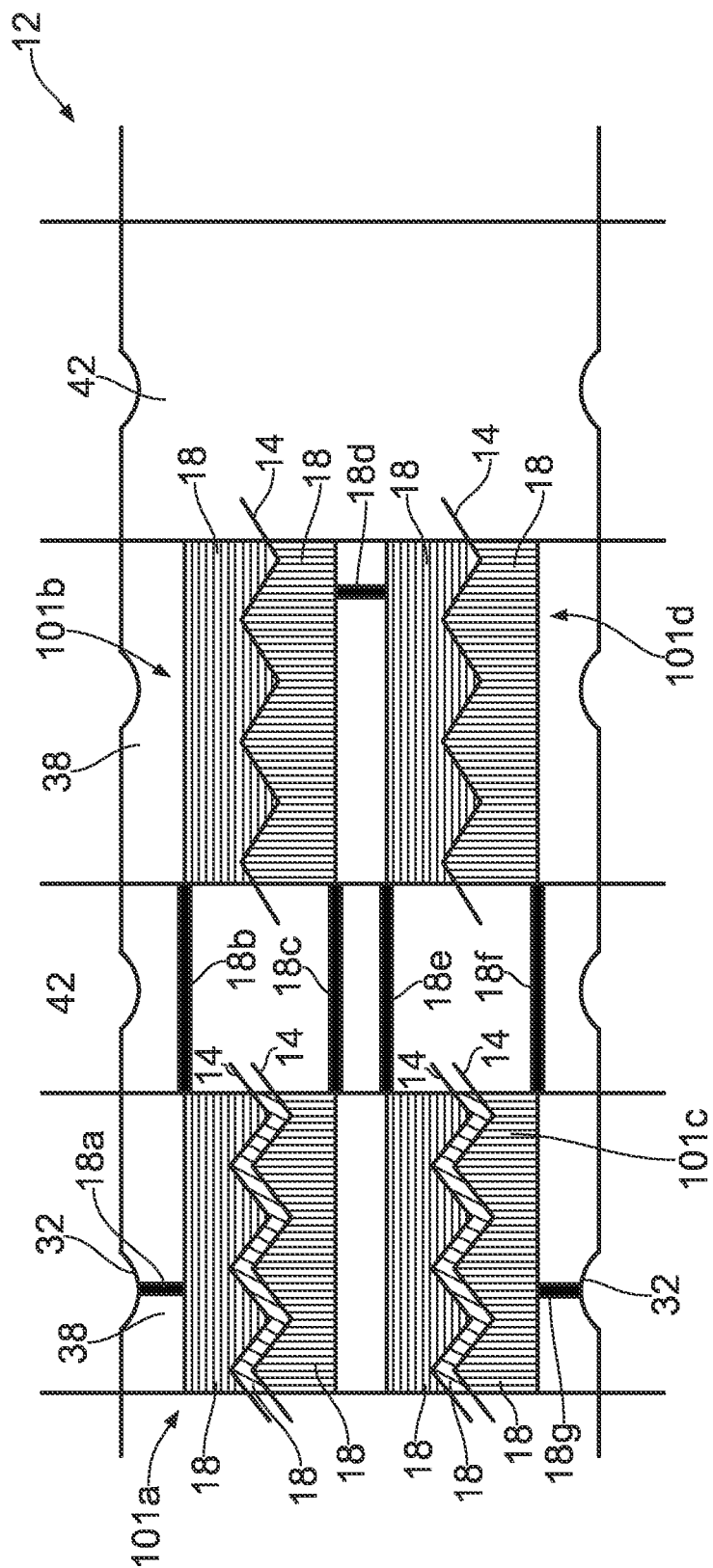
FIG. 5 shows a flexible substrate for an energy storage device according to an embodiment of the present invention.

FIG. 5 shows a strip of flexible substrate 12 formed when the coated web 100 of FIG. 4 is slit along a line of weakening 46.

The flexible substrate 12 comprises two longitudinally spaced patterned regions 38. The patterned regions 38 are spaced apart by masked regions 42 in which no conductor material is deposited on the surface of the substrate 12.

Each patterned region 38 comprises two unit cells (i.e. patches) 101 each comprising one or a series of grooves 14. The grooves 14 each comprise a first face and a second face coated in a metal conductor (not shown) and filled with capacitor material (not shown) as best seen in FIGS. 1 and 2. Conductive metal 18 is coated onto the surface of the flexible substrate 18 in the patterned regions 18 to form patches 101. Each patch 101 is separated from adjacent patches 101 by a mask region free from conductive material.

Conductive ink strips 18a to 18g are printed onto the surface of the substrate 12. In this way, patches 101a and 101b are connected to one another in parallel electrical connection and patches 101c and 101d are connected to one another in parallel electrical connection. Series electrical connections are provided between the pairs of patches 101a/101b and 101c/101d.

The patches 101a to 101d may be electrically connected in any desired configuration of series, parallel or a combination thereof connections. In this way, the capacitance and voltage of the energy storage device 10 formed from the strip of substrate 12 can be varied prior to assembly of the device therefrom.

Figure 6:
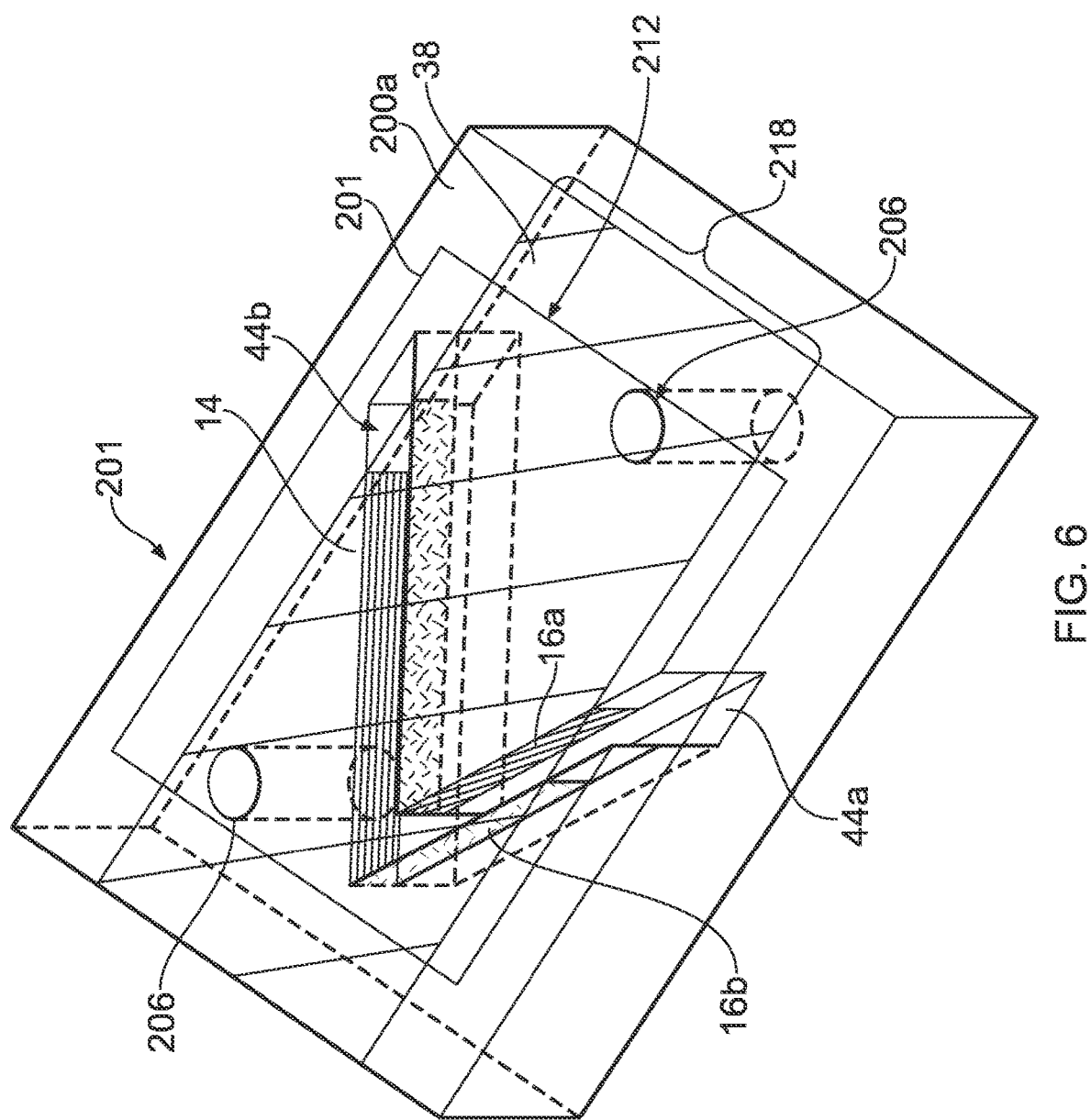
FIG. 6 shows a representative patch on a flexible substrate for an energy storage device according to an embodiment of the present invention.

FIG. 6 shows a representative single patch 201 forming patterned region 38 on a resin coated base layer forming flexible substrate 212.

The patterned region 38 comprises the coated section 218 of metal conductor material deposited on the surface of substrate 212. The patch 201 has a groove 14 having a first face 16a and a second face 16b. In the depicted arrangement, faces 16a and 16b of groove 14 are textured with a roughened surface to increase the surface area of the faces 16a, 16b. In this way, when a dielectric material (not shown) is contained in the groove 14, a supercapacitor is formed.

The ends of the groove 44a, 44b are an uncoated section of the groove that falls outside of the coating region 218. The uncoated sections 44a, 44b at the ends of the groove 14 are free from conductor material.

Interconnecting holes 206 are filled with conductive medium (not shown) such as conductive adhesive such that electrical connection can be achieved by connecting the coated section 218 in electrical contact with each face 16a, 16b of groove 14 with a coated section on an adjacent patch (not shown. When a flexible substrate is assembled into an energy storage device 10 by rolling same, apertures 206 containing conductive material can be used to electrically connect a patterned region overlaying a further patterned region in the rolled flexible substrate. A series and/or parallel connection between patterned regions on a flexible substrate can be provided in this way.

Figure 7:
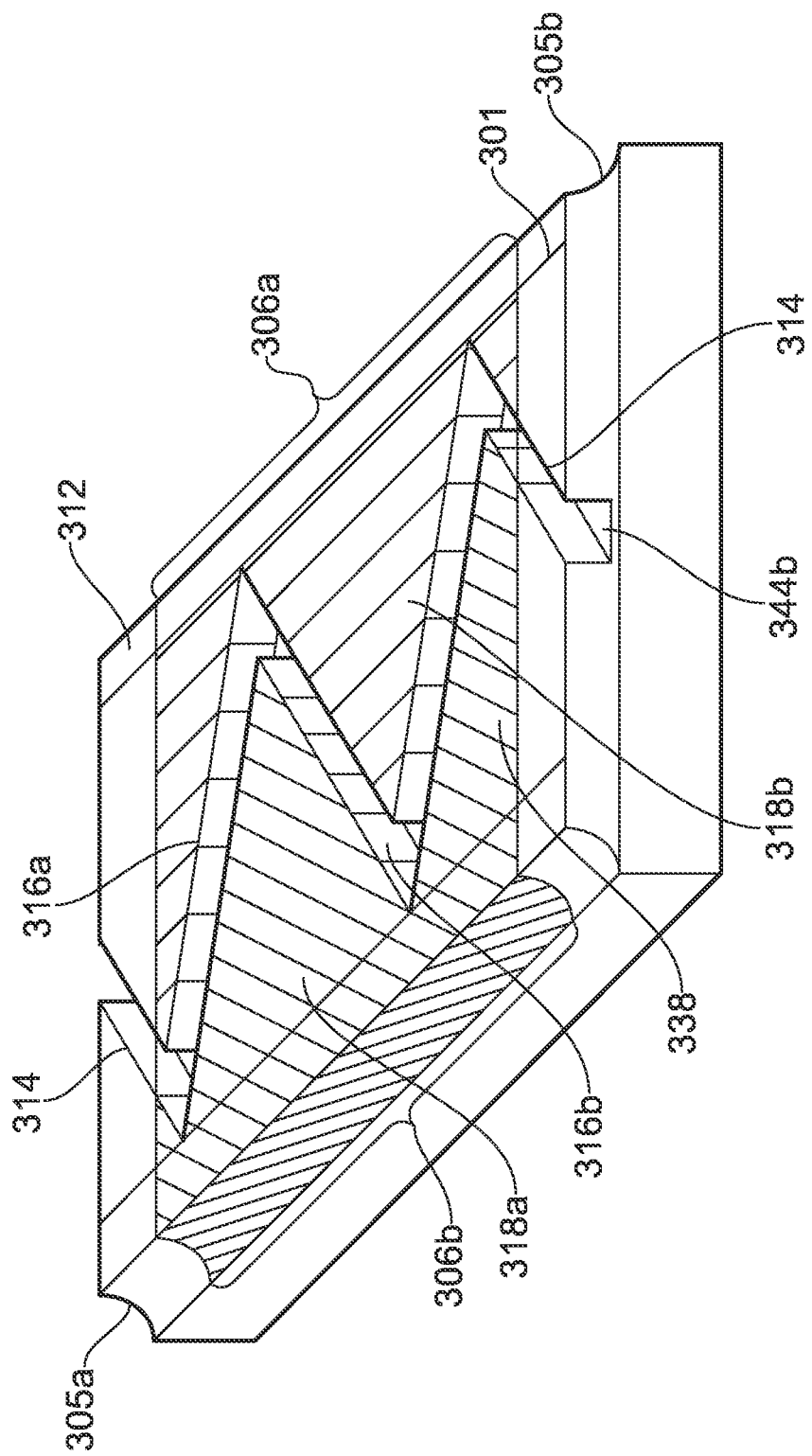
FIG. 7 shows a flexible substrate for an energy storage device according to another embodiment of the present invention.

FIG. 7 shows patterned region 338 with a single patch 301 on the resin embossed flexible substrate 312. Groove 314 has uncoated (conductor free) ends 344a, 344b along with the metal coated section of groove wall 316a, 316b. The groove 314 has a square cross-sectional profile and a zigzag longitudinal configuration.

The flexible substrate 312 has edge connectors in the form of depressions 305a and 305b at opposing edges of the patterned region 338. A metal coating 306b and 306a on the wall of the depressions 305a and 305b provides an electrical conductor in electrical contact with coated regions 318a and 318b which are in electrical contact with the metal conductor (not shown) on the faces 316a and 316b respectively of groove 314.

The metal coating 306b and 306a on the wall of the depressions 305a and 305b provide for easier edge connection between patterned region and/or with an electrical load (not shown) when the flexible substrate 312 is rolled (i.e. assembled) into an energy storage device 10.

Figure 8:
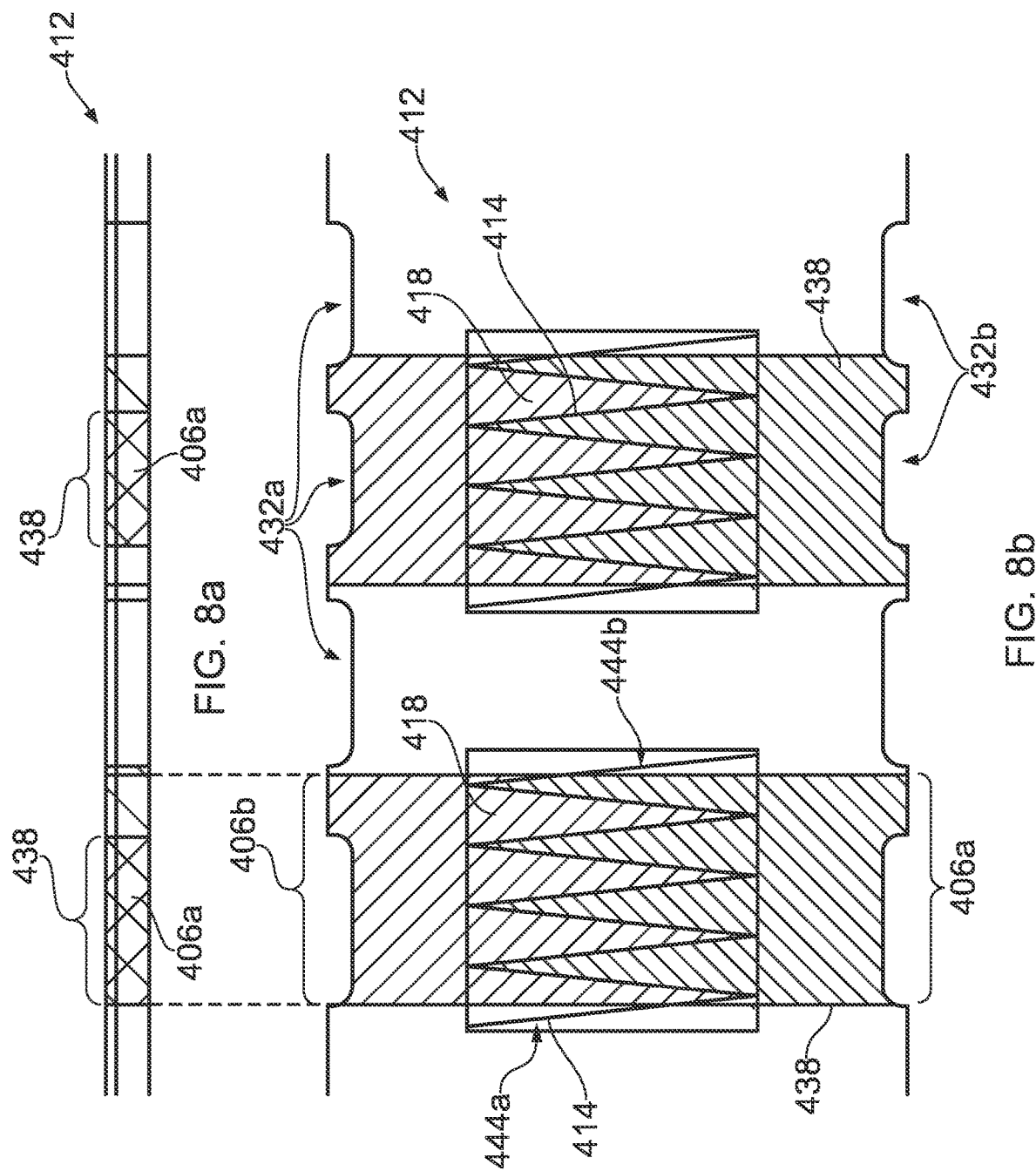
FIGS. 8a and 8b show a side elevation and a plan view of a flexible substrate for an energy storage device according to an embodiment of the present invention.

FIGS. 8a and 8b respectively show a plan and a side elevation of a flexible substrate 412 formed by slitting a coated web (such as that shown in FIG. 4 along the lines of weakening.

Perforations in the coated web forming the line of weakening, when cut through, form edge connectors 432a and 432b. A conductive coating 406a and 406b is applied to the edge connectors 432a, 432b such that the whole web thickness can be utilized for edge connection when assembled. The conductive pathways to the grooves 414 in adjacent patterned regions 438 are provided by the metal coating 418 on the substrate 412.

The grooves 414 have conductor free ends 444a, 444b which are not coated with conductor material.

Figure 9:
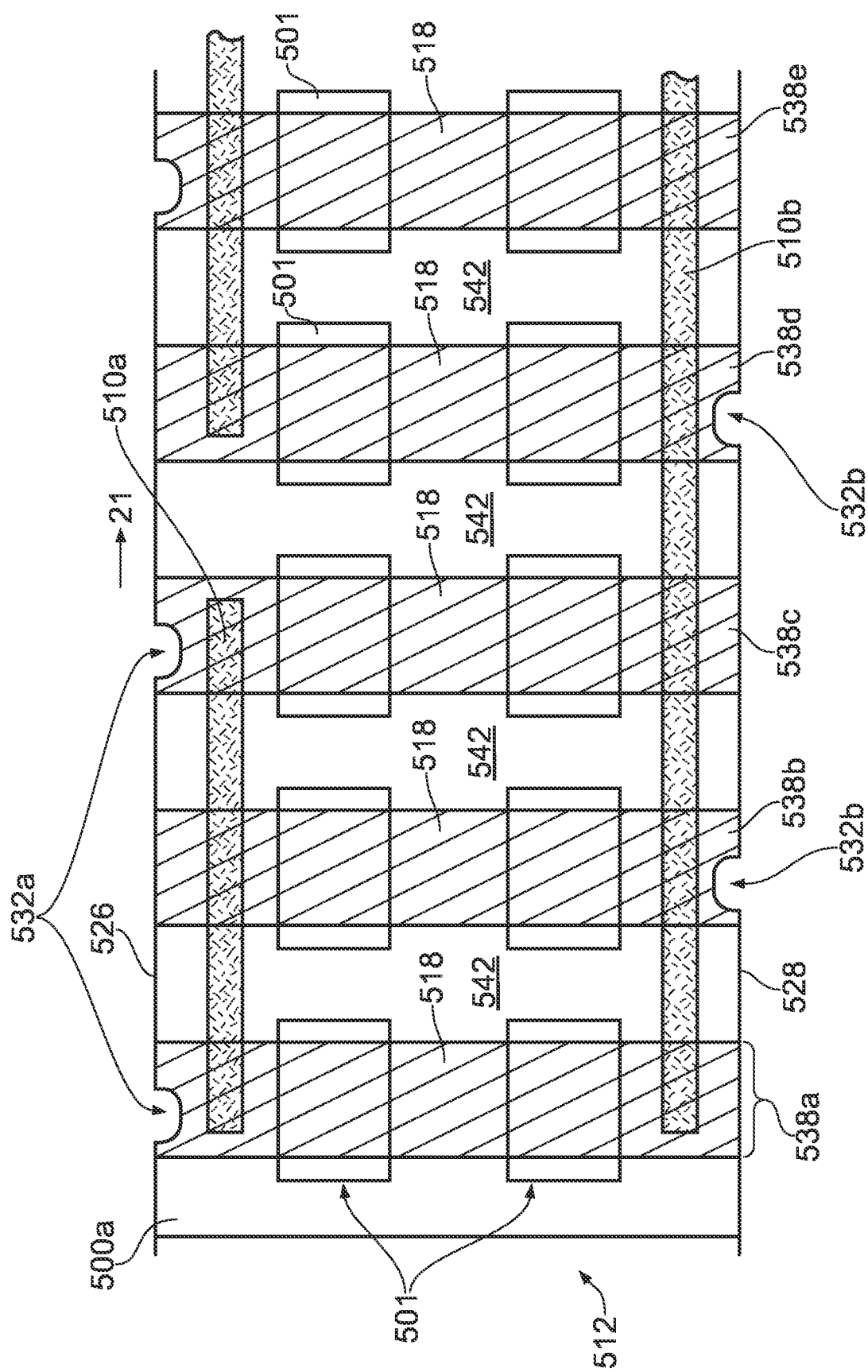
FIG. 9 shows a flexible substrate for an energy storage device according to an embodiment of the present invention.

FIG. 9 shows a flexible substrate 512 for forming an energy storage device 10 according to an embodiment of the invention. Flexible substrate 512 comprises five patterned regions 538a to 538e spaced apart from one another by masked regions 542. Each patterned region 538 has two unit cells (i.e. patches) 501 spaced apart from one another transversely across the flexible substrate 512. Each patch has a groove (not shown) extending longitudinally in the web direction 21. The groove is as described and shown in relation to FIGS. 1 to 8.

Each patterned region 538 comprises a conductive coating 518, such as a metal coating, deposited on the surface of the substrate 512 between edges 526 and 528 of the substrate 512. The conductive coating 518 electrically connects patches 501 in each patterned region 538a to 538e.

Edges connectors 532a and 532b are coated with a conductive layer (not shown).

Patch pairs 501 within each patterned region 538a to 538e are connected in series by the electrically conductive coating 518 in the patterned region 538 and are connected in parallel and series by the printed conductive element (e.g. conductive ink strip) 510a and 510b.

Figure 10:
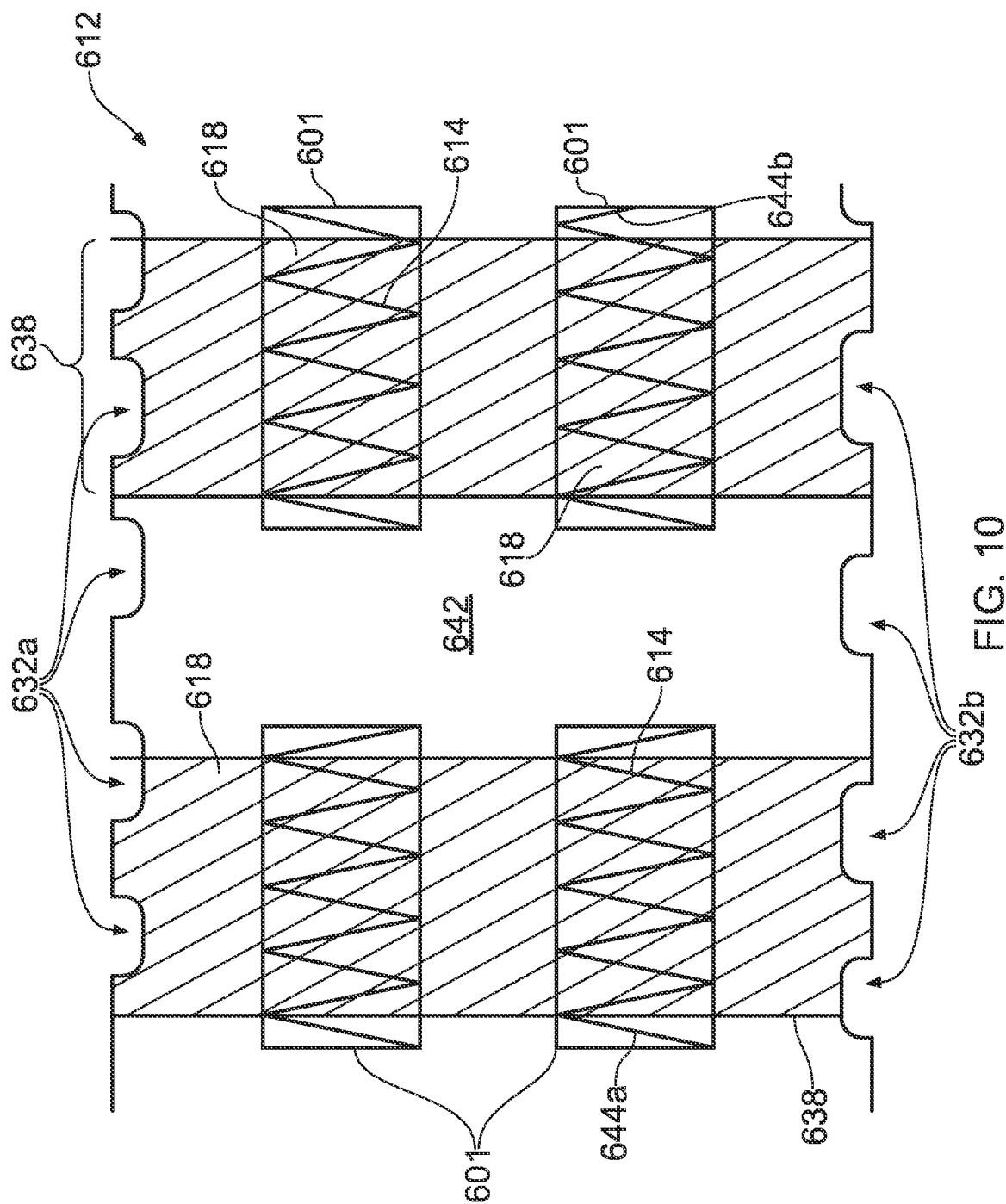
FIG. 10 shows a flexible substrate for an energy storage device according to an embodiment of the present invention.

FIG. 10 shows a flexible substrate 612 with edge connectors 632a and 632b and two patterned regions 638 spaced apart from one another by masked region 642. The masked region 642 is free from a conductor material. Each patterned region 638 comprises a pair of patches 601 electrically connected in the transverse direction of the web by conductive coating (e.g. metal coating) layer 618. Uncoated ends 644a and 644b of the grooves 614 are free of conductive coating. The conductor material (not shown) on the faces (not shown) of the grooves 614 is in electrical contact with conductive coating (e.g. metal coating) layer 618 and the groove is filled with dielectric (capacitor) material (not shown). In this way, the capacitors formed by the groove and the conductor material on the first and second faces of the groove and dielectric material therein in the pair of patches 601 on each patterned region 638 are electrically connected in series. The two patterned regions 638 can be connected in series or in parallel electrical connection according to the capacitance and voltage required of the assembled energy storage device formed by rolling the flexible substrate 612.

Figure 11:
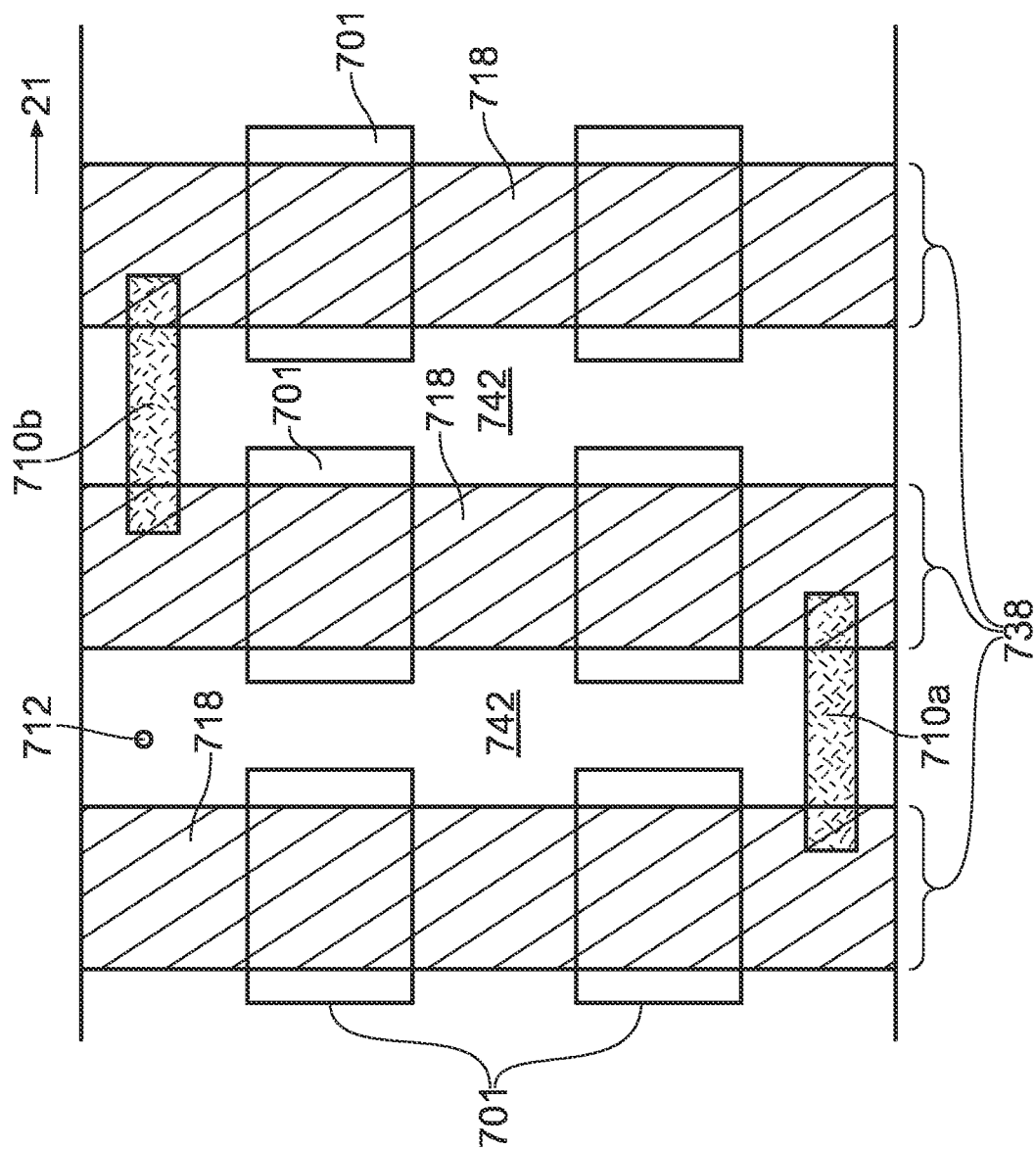
FIG. 11 shows a flexible substrate for an energy storage device according to an embodiment of the present invention.

FIG. 11 shows a flexible substrate 712 with three patterned regions 738 spaced apart from one another by masked regions 742. The masked regions 742 are free from a conductor material. Each patterned region 738 comprises a pair of patches 701 electrically connected in the transverse direction of the web by conductive coating (e.g. metal coating) layer 718. Each patch 701 comprises a groove or a series of grooves (not shown) as previously described. The conductor material (not shown) on the faces (not shown) of the grooves (not shown) is in electrical contact with conductive coating (e.g. metal coating) layer 718 and the groove is filled with dielectric (capacitor) material (not shown). In this way, the capacitors formed by the groove and the conductor material on the first and second faces of the groove and dielectric material therein in the pair of patches 701 on each patterned region 738 are electrically connected in series. The three patterned regions 738 are connected in series by printed conductive elements 710a and 710b.

Figure 12:
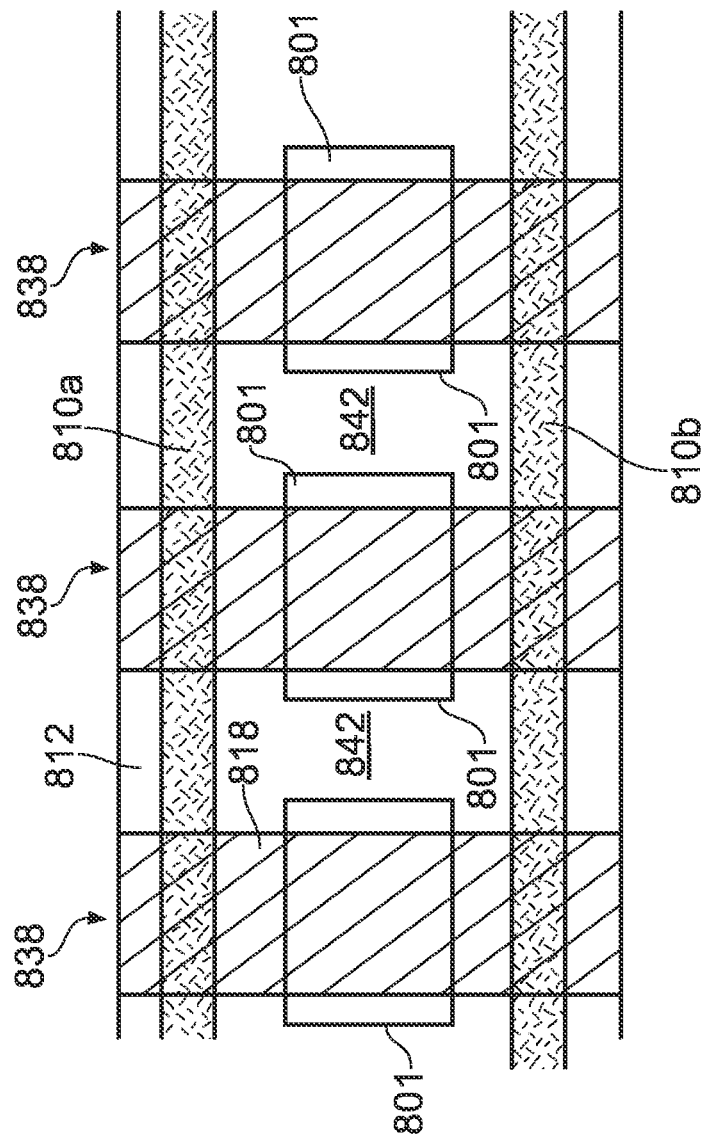
FIG. 12 shows a flexible substrate for an energy storage device according to an embodiment of the present invention.

FIG. 12 shows a flexible substrate 812 with three patterned regions 838 spaced apart from one another by masked regions 842. The masked regions 842 are free from a conductor material. Each patterned region 838 comprises a patch 801 electrically connected to the edges of the web by conductive coating (e.g. metal coating) layer 818. Each patch 801 comprises a groove or a series of grooves (not shown) as previously described. The conductor material (not shown) on the faces (not shown) of the grooves (not shown) is in electrical contact with conductive coating (e.g. metal coating) layer 818 and the groove is filled with dielectric (capacitor) material (not shown). In this way, capacitors are formed by the groove and the conductor material on the first and second faces of the groove and dielectric material therein in patch 801 on each patterned region 838. The three patterned regions 838 are connected in parallel by printed conductive elements 810a and 810b in contact with the conductive coating (e.g. metal coating) layer 818 of each patterned region 838.

Figure 13B:
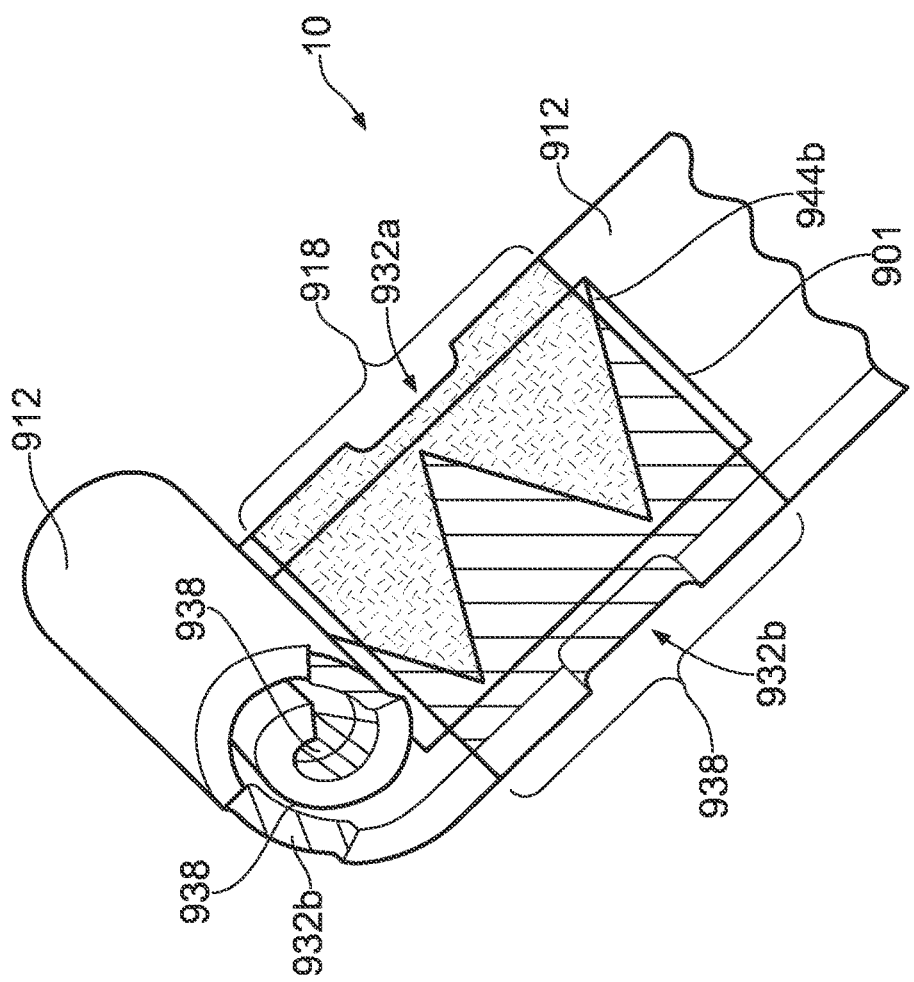
FIG. 13b shows an energy storage device according to an embodiment of the invention in partially rolled (i.e. assembled form)
Figure 13A:
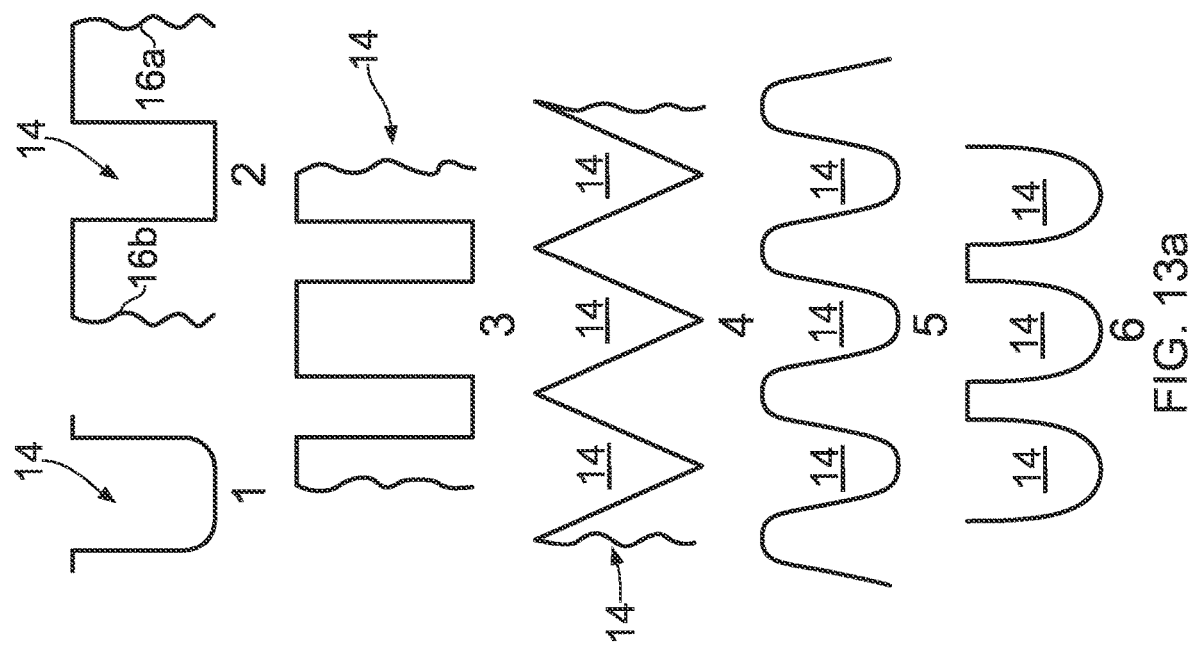
FIG. 13a shows a number of cross-sectional groove profiles for the at least one groove of the flexible substrate according to embodiments of the invention.

FIG. 13a shows the cross-sectional profile of 6 different groove structures. In FIG. 13-1, the groove 14 is a single u-shaped groove. In FIG. 13-2, the groove 14 is a series of two grooves shown in partial cross section. The first groove has a square cross section with smooth faces and the second groove (only the face 16a of which is shown) has a textured first face 16a. FIG. 13-3 shows a square cross section series of two parallel grooves 14. FIG. 13-4 shows a series of parallel grooves 14 having a v-shaped cross section. FIG. 13-5 the series of parallel grooves have a sinusoidal cross sectional profile. FIG. 13-6 shows a series of three parallel grooves with a u-shaped cross section. Any of the groove profiles shown in FIG. 13a are applicable to the embodiments shown in FIGS. 1 to 12 and FIGS. 13b to 18.

FIG. 13b shows an energy storage device 10 according to an embodiment of the invention. The device 10 is shown in partially unrolled (assembled) form. The flexible substrate 912 comprises three patterned regions 938 spaced apart from one another longitudinally along the substrate 912. Each patterned region 938 comprises a single patch (unit cell) 901 having a zigzag shaped groove 914 and a coated conductive region 918. The groove 914 has a structure previously described in relation to FIGS. 1a and 2 in particular. Edge connectors 932a and 932b at the opposing edges of the substrate 912 are coated in a conductive metal layer and can be connected to one another and/or to an electrical load to provide a two terminal device 10. The end 944b of groove 914 remains uncoated by conductor material and in this way prevents inadvertent short circuits forming in the web.

Figure 14:
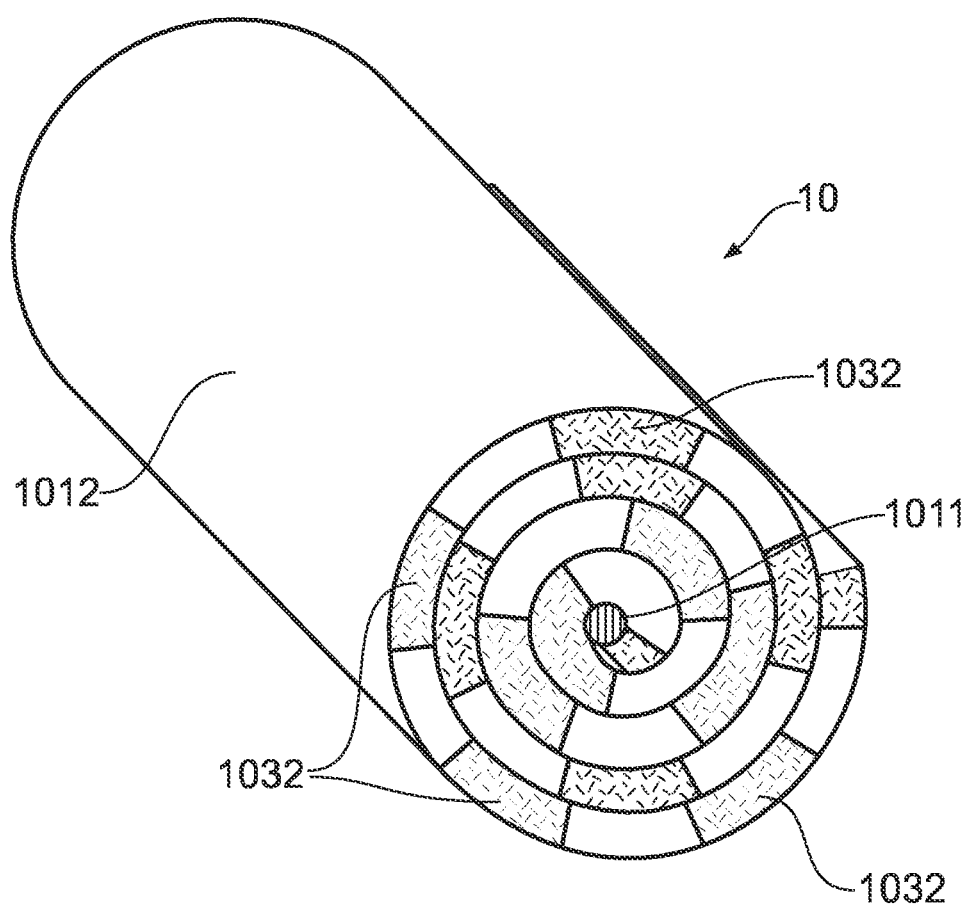
FIG. 14 shows an energy storage device according to an embodiment of the invention in fully rolled (i.e. assembled form)
Figure 15:
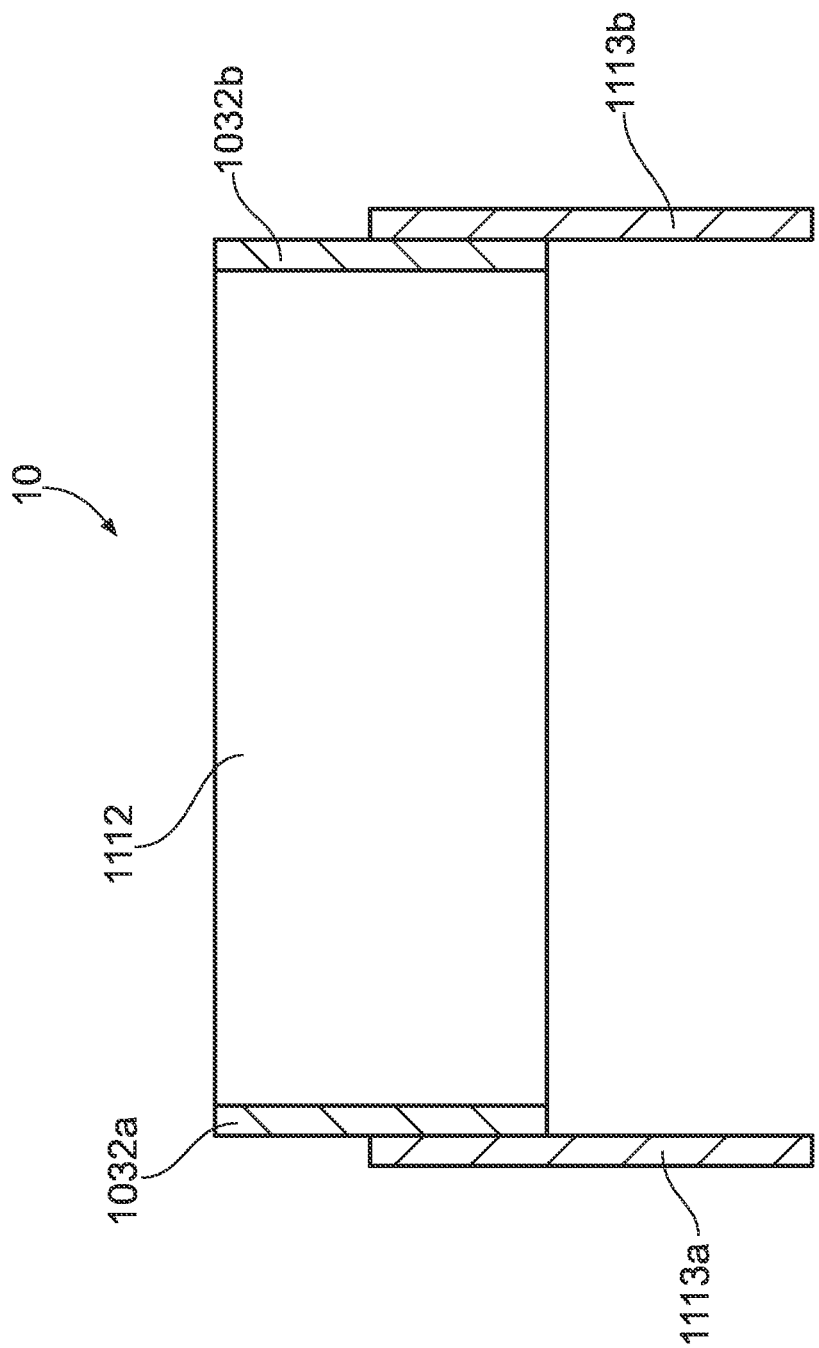
FIG. 15 shows a side elevation of an energy storage device according to an embodiment of the invention in assembled form.
Figure 16:
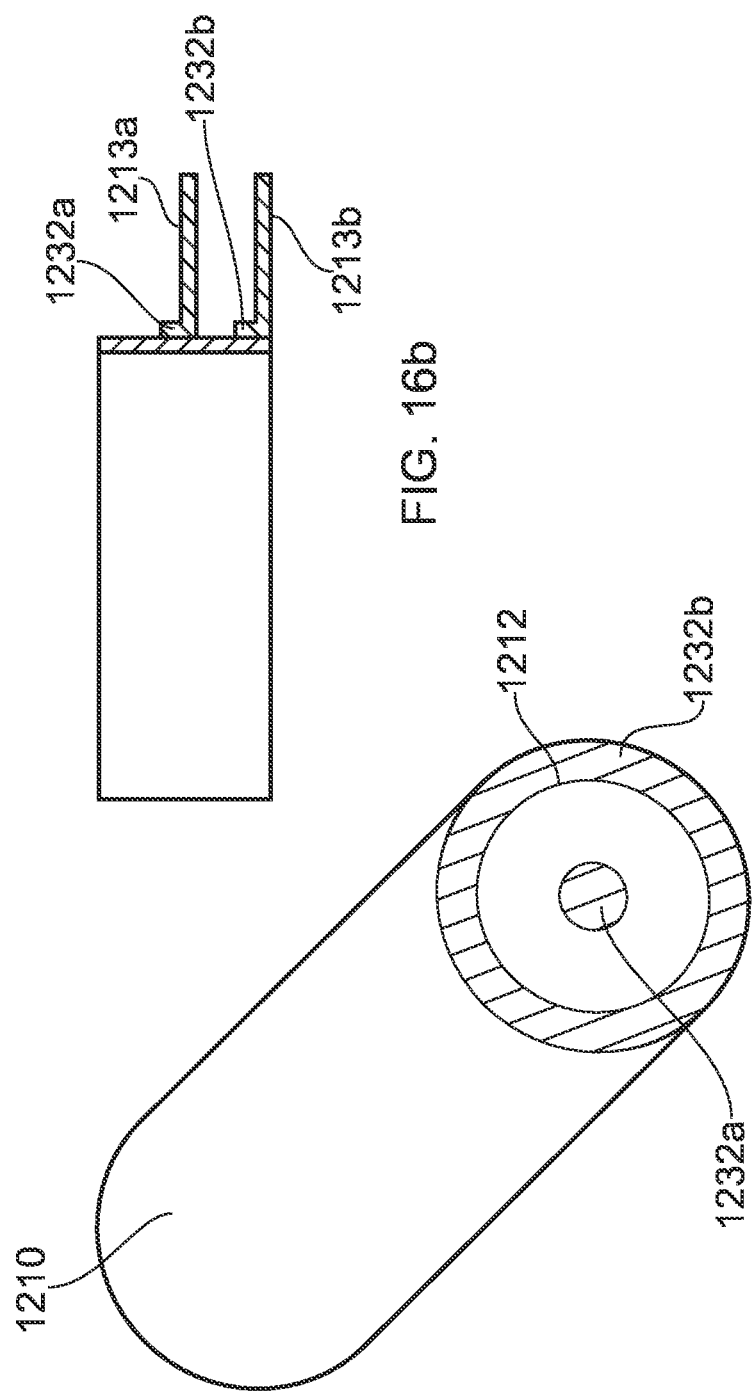
FIG. 16a shows an energy storage device according to an embodiment of the invention in fully rolled (i.e. assembled form)
FIG. 16b shows the energy storage device of FIG. 16a with connecting wires attached.

FIG. 14 shows an assembled energy storage device 10 in which flexible substrate 1012 has been rolled about a central axis of winding 1011 to assemble the device 10. Exposed edge connectors 1032 at an end of the device 10 provide for areas of electrical connections with the patterned regions (not shown). FIG. 15 shows the device 10 of FIG. 14 with the edge connectors 1032a and 1032b respectively connected to conductive wires 1113a and 1113b. The edge connectors 1032a, 1032b are directly connected to the conductive metal coating (not shown) on the web surface (not shown) and the grooves in the patterned regions therewithin.

FIG. 16a shows an energy storage device 1210 formed from a wound flexible substrate 1212. The edge connectors in the centre of the wound substrate 1232a electrically connecting to the at least the first patterned region and the edge connectors outermost of the wound substrate electrically connecting to the at least the last patterned region are covered in electrically conductive material 1232a and 1232b respectively. In FIG. 16b, electrically conductive materials 1232a and 1232b are connected to external wires 1213a and 1213b respectively. The depicted arrangement provides a serial connection within the device 1210 from which electrical charge can be extracted through wires 1213a and 1213b.

Figure 17:
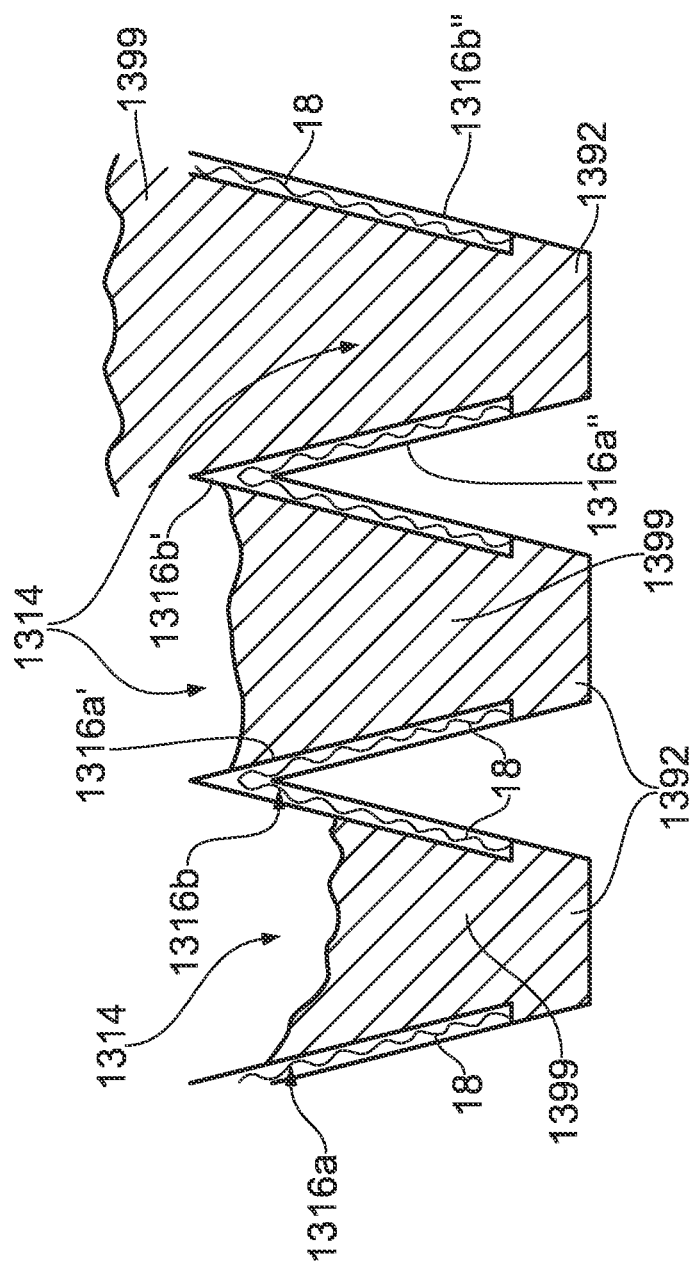
FIG. 17 shows a cross-sectional view of a series of grooves of the flexible substrate according to embodiments of the invention.

FIG. 17 shows a series of grooves 1314 having a metal coating 18 on each face 1316 of each groove. A high dielectric material 1399 in each of the grooves 1314 in contact with the metal coating 18 forms a series of three capacitors.

The conductive metal coating 18 on the first face 1316a of the first groove 1314 is in conductive contact with a conductor extending from the first face 1316a to an edge (not shown) of the flexible substrate (not shown) in which the grooves 1314 are located. The conductive metal coating 18 on the second face 1316b of the first groove 1314 is in contact with a conductive metal coating 18 on the first face 1316a' of the second groove. The conductive metal coating 18 on the second face 1316b' of the second groove 1314 is in contact with a conductive metal coating 18 on the first face 1316a" of the third groove. The conductive metal coating 18 on the second face 1316b" of the third groove 1314 in the series is in conductive contact with a conductor extending from the second face 1316b" to an edge (not shown) of the flexible substrate (not shown) in which the grooves 1314 are located. Each of the grooves has a gap 1392 electrically insulating the metal coating on the first faces 1316 from the metal coating on the second faces 1316 of each groove. In this way, each groove and the materials thereof form a capacitor. Each groove in the series is filled with dielectric material to a different fill level. The first groove is partially filled, the second groove is filled and the third groove is overfilled with dielectric material 1399.

FIG. 18 depicts an alternative energy storage device 1410 according to an embodiment of the invention. Three substantially planar flexible substrates 1412 are laid one on top of the other. For the purposes of clarity in the figure, the substrates 1412 are shown with a spacing therebetween. In the assembled device 1410, the three substrates 1412 would form a layered structure wherein the layers were in contact with one another.

Each flexible substrate 1412 has a patterned region 1438 comprising a single patch (unit cell) 1401. The groove(s) in each patch 1401 are not shown for the sake of clarity. Each patterned region 1438 is electrically connected to the patterned region of the adjacent flexible substrate by a conductive material in holes 1406. The conductive material in the holes 1406 electrically connects adjacent patches 1401 to obtain parallel (or series) interconnections between the adjacent patterned regions as required.

FIG. 19 shows the energy storage device 10 comprising a series of three parallel grooves 14 and capacitor/supercapacitor material 99. The walls of the grooves 14 have a coat of metal conductor 18.

The coat of metal 18 on the first face 16*a* of each groove 14 is not in electrical contact with the coat of metal 18 on the second face 16*b* of each groove 14. There is a gap 92 at the bottom of each groove 14 between the coat of metal 18 on the first face 16*a* of the groove 14 and the coat of metal 18 on the second face 16*b* of the groove 14. Each coat of metal 18 may also referred to as a conductor material.

The capacitor/supercapacitor material 99 overfills the grooves 14 to a depth of "y" above the surface 22, 24 of the substrate 12.

The ratio of the inter groove spacing distance "x" between adjacent grooves 14 and the depth of the capacitor material 99 "y" is 2:1.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. An energy storage device comprising:
   a flexible substrate comprising first and second patterned regions spaced apart from one another along a length of the flexible substrate;
   wherein each patterned region comprises at least one groove extending in a longitudinal direction of the flexible substrate and having a first and a second face;
   wherein the first and second faces are each coated with a conductor and wherein there is no direct electrical communication between the conductors on the first and second faces;
   wherein the at least one groove contains a material for storing electrical potential energy;
   wherein the conductors on the first and the second faces of the at least one groove of each patterned region are each in electrical connection with an electrical conductor at opposing edges of the flexible substrate;
   wherein the first and the second patterned regions are electrically connectable to one another.

2. The energy storage device of claim 1, wherein the first and the second patterned regions are electrically connectable to one another in series or in parallel electrical connection.

3. The energy storage device of claim 1, wherein the first and second patterned regions are electrically connected to one another in series by a conductor material on a surface of the flexible substrate between the first and the second patterned regions.

4. The energy storage device of claim 3, wherein the conductor material on the first face of the at least one groove extends to an edge of the patterned region and the conductor material on the second face of the at least one groove extends to an edge of the patterned region.

5. The energy storage device of claim 4, wherein the conductor material on the first face of the at least one groove extends to an edge of the patterned region defining a positive pole of the patterned region in electrical communication with one of the faces of the groove and the conductor material on the second face of the at least one groove extends to an opposing edge of the patterned region defining a negative pole of the patterned region in electrical communication with other face of the groove.

6. The energy storage device of claim 1, wherein each end of each groove does not include the conductor material.

7. The energy storage device of claim 1, wherein the first and second patterned regions are electrically connected to one another in series by a conductor material through a thickness of the flexible substrate.

8. The energy storage device of claim 1, wherein each patterned region comprises a series of grooves.

9. The energy storage device of claim 1, wherein the flexible substrate comprises at least one additional patterned region, wherein the first patterned region, the second patterned region and the at least one additional patterned region are spaced apart from one another along the length of the flexible substrate.

10. The energy storage device of claim 9, wherein adjacent patterned regions are electrically connected in series.

11. The energy storage device of claim 9, wherein adjacent patterned regions are electrically connected in parallel.

12. The energy storage device of claim 1, wherein each patterned region comprises one or more unit cells.

13. The energy storage device of claim 12, wherein each unit cell is electrically connected to one or more other unit cells in each patterned region.

14. The energy storage device of claim 12, wherein each unit cell comprises a groove or a series of electrically connected grooves.

15. The energy storage device of claim 12, wherein the one or more unit cells of each patterned region are arranged longitudinally along a web.

16. The energy storage device of claim 12, wherein the one or more unit cells of each patterned region are cells arranged transversely across a web.

17. The energy storage device of claim 16, wherein the one or more unit cells arranged transversely across the web are electrically connected to one another in series.

18. The energy storage device of claim 12, wherein the one or more unit cells of each patterned region are arranged longitudinally along a web, wherein when the flexible substrate is rolled at a point of assembly, the one or more unit cells are electrically connected to one another in parallel.

19. The energy storage device of claim 1, wherein at least one of the first and second faces of the at least one groove is profiled.

20. A coated web for an energy storage device comprising:
- a flexible substrate comprising at least two patterned regions separable from one another and arranged transversely across a width of the flexible substrate;
- wherein each patterned region comprises at least one groove having a first and a second face;
- wherein the first and second faces are each coated with a conductor and wherein there is no direct electrical communication between the conductor on the first and second faces;
- wherein the at least one groove contains material for storing electrical potential energy; and
- wherein first and the second face of the at least one groove of each patterned region are each in electrical connection with an electrical conductor coating layer on a surface of the flexible substrate, and wherein the flexible substrate comprises at least one deformation in the electrical conductor coating layer and the flexible substrate and adjoining adjacent patterned regions.

21. The coated web of claim 20, further comprising a flexible polymer or other electrically insulating substrate.

22. The coated web of claim 20, wherein the at least one deformation forms a line of weakening between the adjacent patterned regions arranged transversely across the width of the flexible substrate.

23. The coated web of claim 22, wherein the line of weakening is parallel to a longitudinal axis of the flexible substrate.

24. The coated web of claim 20, wherein the at least one deformation comprises an aperture, a recess, or a dimple.

25. The coated web of claim 20, wherein the flexible substrate comprises at least one aperture therethrough.

26. The coated web of claim 25, wherein the at least one aperture is located in one of the at least two patterned regions.

27. The coated web of claim 25, wherein each patterned region comprises at least one aperture therethrough.

28. The coated web of claim 20, wherein the flexible substrate comprises a plurality of apertures through the flexible substrate at each opposing edge.

29. The coated web of claim 25, wherein each aperture comprises an aperture wall.

30. The coated web of claim 29, wherein the aperture wall is coated with a conductor material.

31. The coated web of claim 29, wherein the aperture wall is profiled.

32. An energy storage device comprising:
- a flexible substrate comprising at least two grooves in a surface thereof, each groove having a first and a second face;
- wherein each of the grooves of the at least two grooves are spaced apart from one another along their length providing an inter-groove spacing therebetween;
- wherein each groove contains a material for storing electrical potential energy, wherein the material for storing electrical potential energy overfills each groove, wherein the material provides a layer of material for storing electrical potential energy over at least a portion of a substrate surface adjacent the first and the second faces of each groove and the inter-groove spacing, wherein the ratio of the inter-groove spacing to the depth of the layer of material for storing electrical potential energy is at least 1:1.

33. The energy storage device of claim 32, wherein the ratio of the inter-groove spacing to the depth of the layer of material for storing electrical potential energy is between about 1:1 and about 5:1.

34. The energy storage device of claim 32, wherein the ratio of the inter-groove spacing to the depth of the layer of material for storing electrical potential energy is at least 2:1.

35. The energy storage device of claim 32, wherein the depth of the layer of material for storing electrical potential energy is less than about 10 microns.

36. The energy storage device of claim 32, wherein the depth of the layer of material for storing electrical potential energy is between about 2 microns and about 20 microns.

37. The energy storage device of claim 32, wherein the flexible substrate comprises an overlayer.

* * * * *